(12) United States Patent
Shin et al.

(10) Patent No.: US 11,462,477 B2
(45) Date of Patent: Oct. 4, 2022

(54) INTERCONNECT STRUCTURE AND ELECTRONIC APPARATUS INCLUDING THE SAME

(71) Applicants: Samsung Electronics Co., Ltd., Suwon-si (KR); UNIST (ULSAN NATIONAL INSTITUTE OF SCIENCE AND TECHNOLOGY), Ulsan (KR)

(72) Inventors: Hyeonjin Shin, Suwon-si (KR); Minhyun Lee, Suwon-si (KR); Changseok Lee, Gwacheon-si (KR); Hyeonsuk Shin, Ulsan (KR); Seokmo Hong, Ulsan (KR)

(73) Assignees: Samsung Electronics Co., Ltd., Gyeonggi-do (KR); UNIST (Ulsan National Institute of Science and Technology), Ulsan (KR)

( * ) Notice: Subject to any disclaimer, the term of this patent is extended or adjusted under 35 U.S.C. 154(b) by 0 days.

(21) Appl. No.: 17/082,494

(22) Filed: Oct. 28, 2020

(65) Prior Publication Data

US 2021/0125929 A1 Apr. 29, 2021

(30) Foreign Application Priority Data

Oct. 29, 2019 (KR) .................. 10-2019-0135755
Jun. 2, 2020 (KR) .................. 10-2020-0066709

(51) Int. Cl.
*H01L 23/532* (2006.01)
*H01L 23/522* (2006.01)

(52) U.S. Cl.
CPC ...... *H01L 23/5329* (2013.01); *H01L 23/5226* (2013.01)

(58) Field of Classification Search
CPC ............ H01L 23/5329; H01L 23/5226; H01L 21/02274; H01L 21/0228
See application file for complete search history.

(56) References Cited

U.S. PATENT DOCUMENTS 6,987,059 B1 * 1/2006 Burke ............... H01L 21/76843
438/643
9,627,500 B2 4/2017 Kim
(Continued)

FOREIGN PATENT DOCUMENTS

KR 2021-0052162 A 5/2021

OTHER PUBLICATIONS

Extended European Search Report dated Mar. 12, 2021, issued in corresponding European Patent Application No. 20204602.5.
(Continued)

*Primary Examiner* — Jaehwan Oh
*Assistant Examiner* — John M Parker
(74) *Attorney, Agent, or Firm* — Harness, Dickey & Pierce, P.L.C.

(57) ABSTRACT

An interconnect structure and an electronic apparatus including the interconnect structure are provided. The interconnect structure includes a conductive layer; a dielectric layer configured to surround at least a part of the conductive layer; and a diffusion barrier layer disposed between the conductive layer and the dielectric layer and configured to limit and/or prevent a conductive material of the conductive layer from diffusing into the dielectric layer, and at least one of the dielectric layer and the diffusion barrier layer includes a boron nitride layer of a low dielectric constant.

21 Claims, 59 Drawing Sheets

(56) References Cited

U.S. PATENT DOCUMENTS

| | | |
|---|---|---|
| 2004/0083973 A1 | 5/2004 | Sakamoto et al. |
| 2007/0082492 A1* | 4/2007 | Kim et al. |
| 2018/0040476 A1* | 2/2018 | Wolf .................. H01L 21/0228 |
| 2018/0047679 A1 | 2/2018 | Cabral, Jr. et al. |
| 2019/0296024 A1 | 9/2019 | Ji et al. |
| 2020/0051921 A1 | 2/2020 | Lee et al. |
| 2021/0123161 A1 | 4/2021 | Lee et al. |

OTHER PUBLICATIONS

Jun Liu et al., 'Plasma deposition of low dielectric constant (k=2.2-2.4) Boron Nitride on methylsilsesquioxane-based nanoporous films' *Journal of Applied Physics*, vol. 96, No. 11, Dec. 2004, pp. 6679-6684.

Extended European Search Report dated Mar. 19, 2021, issued in corresponding European Patent Application No. 20204299.0.

Lei Li and Xiang Ming Chen, 'On the measured dielectric constant of amorphous boron nitride' *Nature*, vol. 590, No. 7844, Feb. 2021, pp. E6-E7.

S. V. Nguyen et al., 'Plasma-Assisted Chemical Vapor Deposition and Characterization of Boron Nitride Films' *Journal of the Electrochemical Society*, vol. 141, No. 6, Jun. 1994, pp. 1633-1638.

Wikipedia, 'Back end of line', Oct. 2020, retrieved Feb. 22, 2021 at https://en.wikipedia.org/wiki/Back_end_of_line.

* cited by examiner

FIG. 7C

| Samples | B (at%) | N (at%) | H (at%) |
|---|---|---|---|
| a-BN | 47.6 | 46.9 | 5.5 |

FIG. 12

| | Electrical properties | | Film properties | |
|---|---|---|---|---|
| | Dielectric constant @100 kHz / @1 MHz | Breakdown Field (MV-cm$^{-1}$) | Refractive index (n) @ 633 nm | Density (g-cm$^{-3}$) |
| h-BN | 3.28 / 2.87 | 2.2 | 2.16 | 2.1 |
| a-BN | 1.78 / 1.16 | 7.3 | 1.37 | 2.1~2.3 |

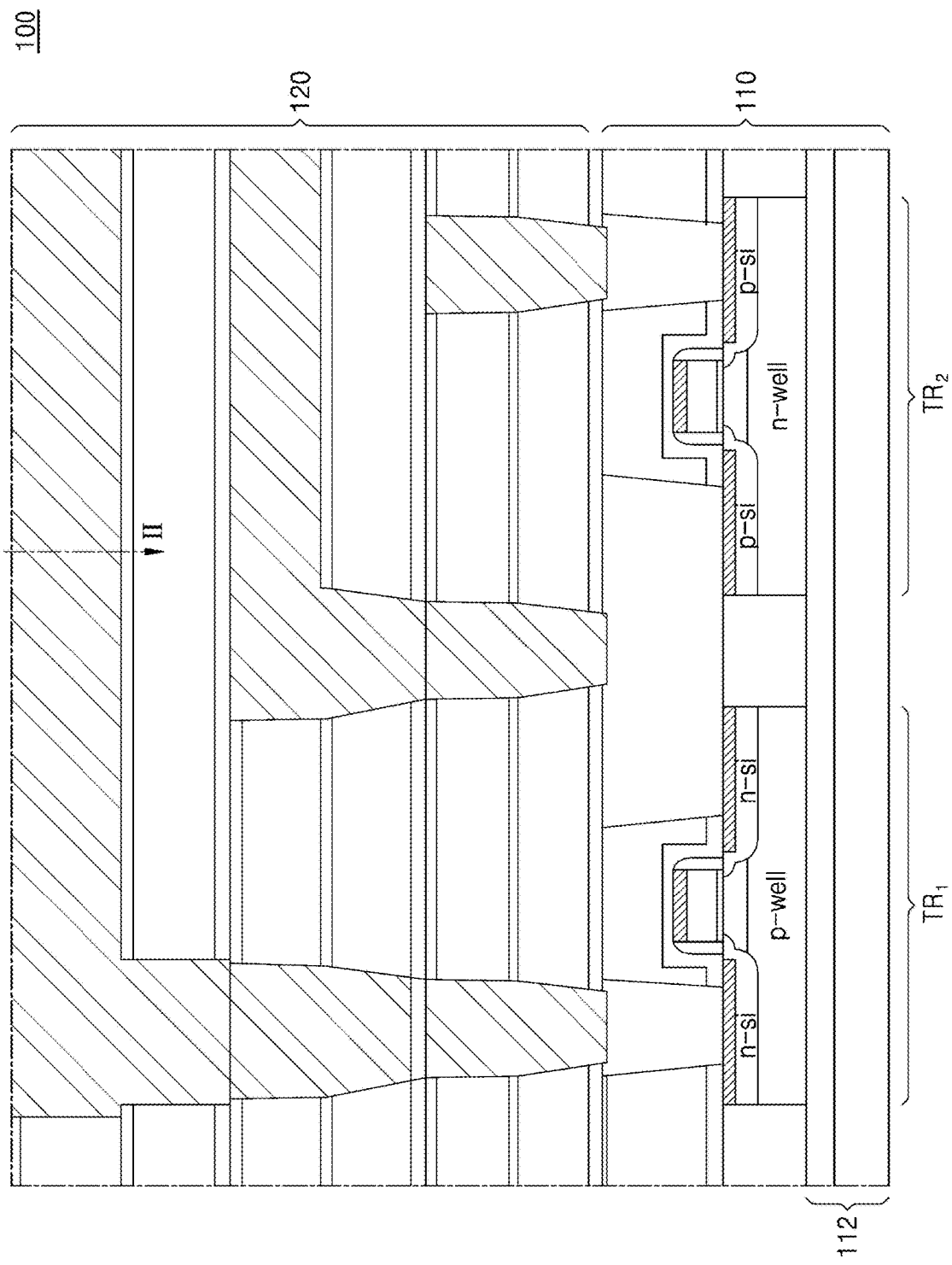

ional Patent
INTERCONNECT STRUCTURE AND ELECTRONIC APPARATUS INCLUDING THE SAME

CROSS-REFERENCE TO RELATED APPLICATION

This application claims the benefit of Korean Patent Application Nos. 10-2019-0135755, filed on Oct. 29, 2019, and 10-2020-0066709, filed on Jun. 2, 2020, in the Korean Intellectual Property Office, the disclosure of each of which is incorporated herein in its entirety by reference.

BACKGROUND

1. Field

The present disclosure relates to interconnect structures and electronic apparatuses including the same, and more particularly to, interconnect structures including boron nitride layers and electronic apparatuses including the same.

2. Description of Related Art

Electronic devices and semiconductor devices may be mostly fabricated by combining and connecting a semiconductor, an insulator, and a conductor. For example, electronic devices and semiconductor devices may be arranged to form a plurality of unit devices on a semiconductor substrate and then stack insulating layers (interlayer insulating layers) and electrode layers are repeatedly stacked thereon, thereby fabricating various integrated circuits.

However, in a process of fabricating or operating such devices, the temperature of constituent layers may increase and electrical stress may occur due to the application of a voltage/current. This may result in diffusion of materials (atoms) between adjacent constituent layers, which may deteriorate the properties of the devices and also reduce the reliability and durability thereof. As a degree of integration of such devices increases, it may be more difficult to solve problems caused by the diffusion of materials between the constituent layers. In addition, even when no diffusion of the material occurs, a signal delay may occur due to mutual interference caused by an electric field between layers of a device having a high degree of integration.

SUMMARY

Provided are interconnect structures that use a boron nitride layer as a diffusion barrier layer and electronic apparatuses including the interconnect structures.

Provided are interconnect structures that use a boron nitride layer as an interlayer insulating layer and electronic apparatuses including the interconnect structures.

Additional aspects will be set forth in part in the description which follows and, in part, will be apparent from the description, or may be learned by practice of the presented embodiments of the disclosure.

According to an embodiment, an interconnect structure includes a conductive layer; a dielectric layer surrounding at least a part of the conductive layer; and a diffusion barrier layer between the conductive layer and the dielectric layer, the diffusion barrier layer configured to limit a conductive material of the conductive layer from diffusing into the dielectric layer. At least one of the dielectric layer and the diffusion barrier layer include at least one of an amorphous boron nitride layer and a nanocrystalline boron nitride layer.

In some embodiments, diffusion barrier layer may include at least one of the amorphous boron nitride layer and the nanocrystalline boron nitride layer, and the dielectric layer may include a different dielectric material from the boron nitride layer included in the diffusion barrier layer.

In some embodiments, the dielectric layer and the diffusion barrier layer both may include at least one of the amorphous boron nitride layer and the nanocrystalline boron nitride layer.

In some embodiments, the dielectric layer and the diffusion barrier layer may be integrated with each other.

In some embodiments, the dielectric layer may include at least one of the amorphous boron nitride layer and the nanocrystalline boron nitride layer, and the diffusion barrier layer may include a metal other than boron.

In some embodiments, a thickness of the diffusion barrier layer may be 5 nm or less.

In some embodiments, a thickness of the dielectric layer may be 5 nm or more.

In some embodiments, a least one of the dielectric layer and the diffusion barrier layer may have a dielectric constant of 2.5 or less at an operating frequency of 100 kHz.

In some embodiments, at least one of the dielectric layer and the diffusion barrier layer may have a ratio of boron to nitrogen of about 0.9 to about 1.1.

In some embodiments, at least one of the dielectric layer and the diffusion barrier layer may be non-porous.

In some embodiments, at least one of the dielectric layer and the diffusion barrier layer may include at least one pore.

In some embodiments, at least one of the dielectric layer and the diffusion barrier layer may have a mass density of 1 to 3 g/cm$^3$.

In some embodiments, a breakdown field of at least one of the dielectric layer and the diffusion barrier layer may be 4 MV·cm$^{-1}$ or more.

In some embodiments, at least one of the dielectric layer and the diffusion barrier layer may have about 0.3 to about 0.6 root-mean-square (RMS) roughness value.

In some embodiments, at least one of the dielectric layer and the diffusion barrier layer may have a hydrogen content of 10% or less.

In some embodiments, the dielectric layer may include a first dielectric layer including a trench of a first depth, the diffusion barrier layer may include a first diffusion barrier layer on an inner wall of the trench, and the conductive layer may include a first conductive layer filling an inside of the trench.

In some embodiments, the dielectric layer may include a second dielectric layer including a via hole, the diffusion barrier layer may include a second diffusion barrier layer on an inner wall of the via hole, and the conductive layer may include a second conductive layer filling an inside of the via hole.

In some embodiments, the via hole may be stepped.

According to an embodiment, an interconnect structure includes a conductive layer and a boron nitride structure surrounding at least part of the conductive layer. The boron nitride structure includes at least one of an amorphous boron nitride layer and a nanocrystalline boron nitride layer. The boron nitride structure is configured to limit a conductive material of the conductive layer from diffusing through at least a portion of the boron nitride structure.

In some embodiments, the boron nitride structure may include a dielectric layer, the dielectric layer may define a trench, and the conductive layer may be in the trench.

In some embodiments, interconnect structure may further include a dielectric layer. The dielectric layer may define a trench. The conductive layer may be in the trench. The boron nitride structure may include a diffusion barrier layer between the conductive layer and the dielectric layer.

In some embodiments, the boron nitride structure may be on a top surface of the conductive layer.

According to an embodiment, an electronic apparatus includes a device layer including at least one of a transistor, a capacitor, and a resistor; and one of the above-described interconnect structures connected to the device layer.

In some embodiments, the device layer may include at least one of a memory device, a display device, and an integrated circuit device.

BRIEF DESCRIPTION OF THE DRAWINGS

The above and other aspects, features, and effects of certain embodiments of the disclosure will be more apparent from the following description taken in conjunction with the accompanying drawings, in which:

FIG. 7C shows a composition ratio of a boron nitride layer calculated using HR-RBS and HR-ERDA spectra;

FIG. 12 is a table summarizing the properties of an amorphous boron nitride layer and a hexagonal boron nitride layer according to an embodiment;

FIG. 23 is a diagram schematically illustrating an electronic apparatus including an interconnect structure according to an embodiment;

DETAILED DESCRIPTION

Figure 1:
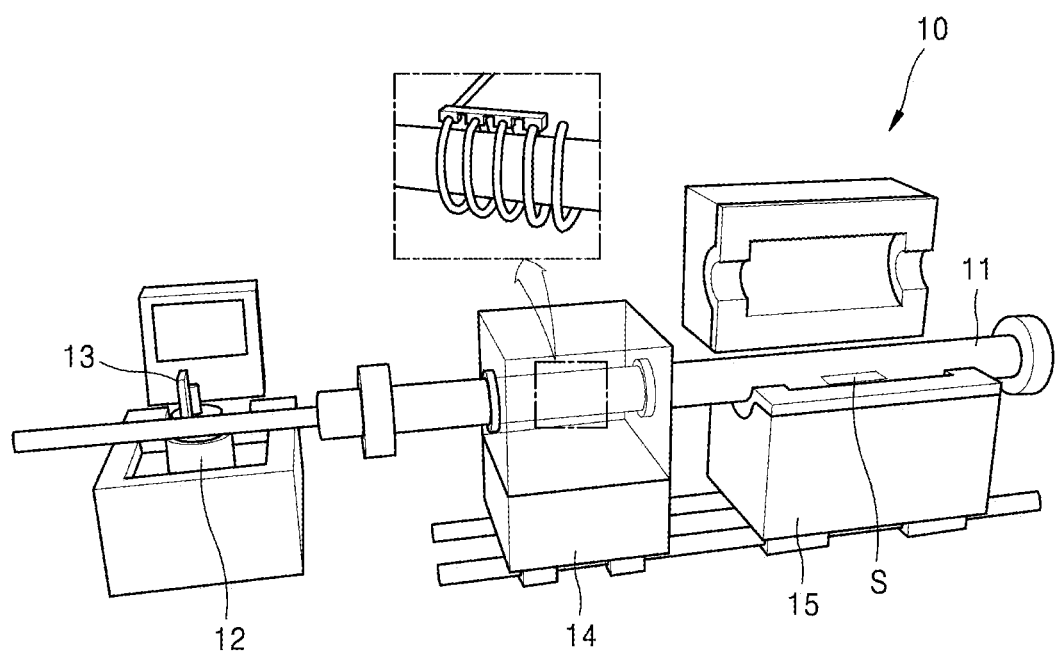
FIG. 1 is a diagram schematically showing a system for fabricating a boron nitride layer, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. In the accompanying drawings, wherein like reference numerals refer to like elements throughout. Also, the size of each layer illustrated in the drawings may be exaggerated for convenience of explanation and clarity. In this regard, the present embodiments may have different forms and should not be construed as being limited to the descriptions set forth herein.

It will also be understood that when an element is referred to as being "on" or "above" another element, the element may be in direct contact with the other element or other intervening elements may be present. An expression used in the singular encompasses the expression of the plural, unless it has a clearly different meaning in the context. It should be understood that, when a part "comprises" or "includes" an element in the specification, unless otherwise defined, other elements are not excluded from the part and the part may further include other elements. The use of the terms "the" and similar referents in the context are to be construed to cover both the singular and the plural.

In the embodiments below, a boron nitride layer, a method of fabricating the boron nitride layer by using plasma, and an apparatus including the boron nitride layer will be described.

FIG. 1 is a diagram schematically showing a system 10 for fabricating a boron nitride layer, according to an embodiment. Referring to FIG. 1, the system 10 for fabricating the boron nitride layer may include a chamber 11 including a space in which a reaction gas for growth of the boron nitride layer may move, a supply source 12 that supplies the reaction gas to the chamber 11, a flow rate controller 13 that controls the mass flow of the reaction gas moving to the chamber 11, a plasma apparatus 14 that generates plasma in the chamber 11 and a furnace 15 that adjusts the temperature of the chamber 11, and may deposit the boron nitride layer in the chamber 11. In addition, the apparatus for adjusting the temperature may be a hot wall type in which radiant heat is transferred to a substrate, or a cold wall type in which the substrate is directly heated.

Figure 2A:
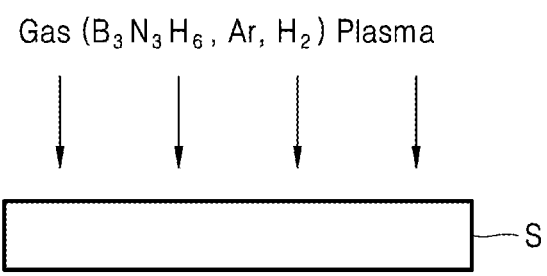
FIGS. 2A to 2C are reference diagrams illustrating a method of fabricating a boron nitride layer, according to an embodiment.
Figure 2B:
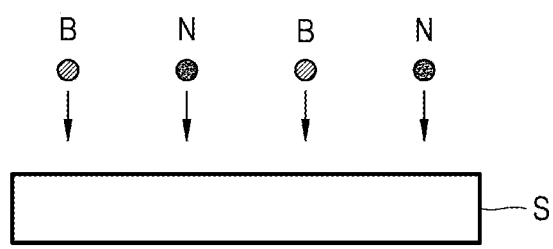
Figure 2C:

FIGS. 2A to 2C are reference diagrams illustrating a method of fabricating a boron nitride layer, according to an embodiment.

First, a substrate S may be prepared in the chamber 11 of the system 10. The substrate S may include at least one of a Group IV semiconductor material, a semiconductor compound, an insulating material, and metal. As a specific example, the substrate S may include the Group IV semiconductor material such as Si, Ge, or Sn. Alternatively, the substrate S may include at least one of Si, Ge, C, Zn, Cd, Al, Ga, In, B, C, N, P, S, Se, As, Sb, Te, Ta, Ru, Rh, Ir, Co, Ta, Ti, W, Pt, Au, Ni, and Fe. In addition, the substrate S may further include, for example, N and F as a SiCOH-based composition, and may also include pores to lower the permittivity. In addition, the substrate S may further include a dopant. The materials of the substrate S mentioned above are merely examples.

The substrate S may be pretreated before the substrate S is disposed in the chamber 11. For example, the substrate S may be immersed in an organic solvent such as acetone, sonicated, and then cleaned with iso-propenyl alcohol (IPA) and nitrogen gas. A plasma treatment such as oxygen, hydrogen, $NH_3$, etc. may be performed on the surface of the substrate S, which is cleaned, such that carbon impurities remaining on the surface may be removed. In addition, the substrate S may be immersed in an HF solution to remove natural oxides or remove a residual HF solution using anhydrous ethanol and $N_2$ gas.

The process temperature for growing the boron nitride layer may be about 700° C. or less, which is lower than the temperature used for a chemical vapor deposition process. For example, the process temperature of the inside of the chamber 11 may be about 400° C. Before the process temperature rises, the process pressure for growing the boron nitride layer may be set to about 2 Torr or less. For example, the process pressure may be $10^{-2}$ Torr or less.

Next, a reaction gas for growing the boron nitride layer may be injected into the chamber 11. Here, the reaction gas may be a source for boron nitride for the growth of the boron nitride layer and may be a source including both nitrogen and boron, such as borazine ($B_3N_3H_6$) or ammonia-borane ($NH_3$—$BH_3$). Alternatively, the reaction gas may include a nitrogen source including nitrogen and a boron source including boron. The nitrogen source may include at least one of ammonia ($NH_3$) or nitrogen ($N_2$), and the boron source may include at least one of $BH_3$, $BF_3$, $BCl_3$, $B_2H_6$, $(CH_3)_3B$, and $(CH_3CH_2)_3B$.

The reaction gas may further include an inert gas. The inert gas may include, for example, at least one of argon gas, neon gas, nitrogen gas, helium gas, krypton gas, and xenon gas. The reaction gas may further include a hydrogen gas. In addition, the mixing ratio of the reaction gas injected into the chamber 11 may be variously modified according to the growth conditions of the boron nitride layer.

The flow rate controller 13 may control the flow rate of the reaction gas flowing into the chamber 11. The flow rate of the boron nitride gas may be lower than other reactant gases. When the boron nitride layer is to grown using plasma, the mixing ratio of the reaction gas injected into the chamber 11, that is, the volume ratio of the source of boron nitride and the inert gas, may be, for example, about 1:10 to 5000, and the volume ratio of the source of boron nitride, the inert gas, and the hydrogen gas, may be, for example, about 1:10 to 5000:10 to 500.

Since the source for boron nitride is significantly smaller in proportion to other reaction gases, the crystallinity of boron nitrides may be weak. Thus, the boron nitride layer according to an embodiment may be formed in an amorphous or a nano-sized crystal structure.

When an excess amount of the source for boron nitride is supplied, the boron nitride layer may grow irregularly, and a precursor may be adsorbed, and thus, the flow rate of the source for boron nitride may be low.

For example, while growing the boron nitride layer, the flow rate controller 13 may control the flow rate of the source for boron nitride to 0.05 sccm, the flow rate of the inert gas to 50 sccm, and the flow rate of the hydrogen gas to 20 sccm. The flow rate controller 13 controls the flow rates of the boron nitride source and the inert gas, but is not limited thereto. The flow rate controller 13 may control only the flow rate of the source for boron nitride.

Subsequently, the plasma apparatus 14 may generate plasma inside the chamber 11 while the source for boron nitride is introduced into the chamber 11. Here, the power for plasma generation may be about 10 W to about 4000 W. For example, the power for plasma generation is about 30 W, but is not limited thereto.

The plasma apparatus 14 may be an apparatus that provides plasma including an inductively coupled plasma, a capacitively coupled plasma, a microwave plasma, a plasma enhanced method, an electron cyclotron resonance plasma, arc discharge plasma, a helicon plasma, etc., but is not limited thereto. For example, an inductively coupled plasma apparatus may provide a kind of plasma in which energy is supplied by a current generated by electromagnetic induction, that is, a magnetic field that changes over time. When the power for generating plasma is applied to the inside of the chamber 11 from the plasma apparatus 14, an electric field may be induced inside the chamber 11. As described above, when the electric field is induced in a state where the reaction gas is injected, plasma for the growth of a boron nitride layer BN may be formed.

Referring to FIG. 2B, activated nitrogen N* and activated boron B* may be generated by the plasma of the reaction gas in which the carbon source, the inert gas, and the hydrogen gas are mixed and may be adsorbed onto the surface of the substrate S. In addition, the plasma of the inert gas may continuously induce the activation of the substrate S, and thus, the adsorption of the activated nitrogen N* and the activated boron B* onto the surface of the substrate S may be accelerated. The activated nitrogen N* and the activated boron B* may be adsorbed as amorphous. Even if activated nitrides and boron are combined with each other, since an amount thereof is small, activated nitrides and boron may be adsorbed as the nano-sized crystal.

Referring to FIG. 2C, as the adsorption of the activated nitrogen N* and the activated boron B* onto the surface of the substrate S is accelerated even at a low temperature, the boron nitride layer BN may grow on the surface of the substrate S. According to the present embodiment, since the boron nitride layer BN directly grows on the surface of the substrate S by a low ratio of the activated nitrogen N* and the activated boron B* at a low temperature, for example, at a temperature of 700° C. or less, the boron nitride layer BN, which is grown, may have weak crystalline.

The boron nitride layer BN according to an embodiment may grow as amorphous or may nitride grow as the nano-sized crystal. Although there is a crystal in the boron nitride layer BN formed as amorphous, there may be a crystal of 3 nm or less, and the boron nitride layer BN formed as the nano crystal may include crystals having a size of about 100 nm or less. More specifically, the boron nitride layer BN may include crystals having a size of about 0.5 nm to about 100 nm.

The thickness of the boron nitride layer BN according to an embodiment may be about 100 nm or less. For example, the thickness of the boron nitride layer BN may be 50 nm or less. Further, the boron nitride layer BN may be formed to be thin because the boron nitride layer BN includes amorphous or nano crystals. However, the boron nitride layer BN is not limited thereto. Since the boron nitride layer BN includes amorphous or nano crystals, the boron nitride layer BN may be formed to be thick. The thickness of the boron nitride layer BN may be selected according to the field of application.

After growth, the plasma may be turned off and the furnace 15 may be gradually cooled at the room temperature. For example, the furnace 15 may be cooled at the room temperature by introducing 20 sccm of $H_2$ gas into the chamber 11.

A device may be fabricated by forming another layer on the boron nitride layer BN fabricated by using the above-described method. Alternatively, the fabricated boron nitride layer BN may be transferred to another layer. When transferred, a hydrofluoric acid transfer technique may be applied, but the present disclosure is not limited thereto.

The boron nitride layer BN fabricated as shown in FIGS. 2A to 2C may be amorphous. Although the boron nitride layer BN according to an embodiment includes a crystal, the boron nitride layer BN may include the nano-sized crystal. Because activated nitrogen and boron of a low density directly grow at a low temperature, the crystallinity may be weak. The lower at least one of the growth temperature and the process pressure, the higher the content of amorphous.

In the boron nitride layer BN according to an embodiment, the ratio of nitrogen and boron may be substantially the same. The ratio of boron to nitrogen may be about 0.9 to about 1.1. Further, the boron nitride layer BN may contain hydrogen, but the hydrogen content in the boron nitride layer BN may be small. For example, hydrogen may be about 10% or less and greater than 0%. The boron nitride layer BN may be chemically stable because of its low content of hydrogen.

The boron nitride layer BN according to an embodiment may have a dielectric constant of 3 or less at an operating frequency of about 100 kHz (here, the dielectric constant may mean a relative dielectric constant versus vacuum or air). For example, an amorphous boron nitride layer a-BN may have a dielectric constant of 2.3 or less at the operating frequency of about 100 kHz, and a nanocrystalline boron nitride layer nc-BN may have a dielectric of 2.3 to 2.5 at the operating frequency of about 100 kHz.

In addition, the mass density of the boron nitride layer BN according to an embodiment may vary according to the dielectric constant of the boron nitride layer BN. For example, the boron nitride layer BN according to an embodiment may have a mass density of 1 to 3 $g/cm^2$.

In addition, the breakdown field of the boron nitride layer BN according to an embodiment may be 4 $MVcm^{-1}$ or more. Specifically, the breakdown field of the boron nitride layer BN according to an embodiment may be about 5 to about 10 $MVcm^{-1}$.

The boron nitride layer BN according to an embodiment may have a smooth surface. For example, the surface of the boron nitride layer BN may have a root-mean-square (RMS) roughness value of about 0.3 to about 0.6. The surface roughness of the boron nitride layer BN may be determined by the flow rate of the source for boron nitride.

To obtain the properties of the boron nitride layer BN, the boron nitride layer BN was grown on a Si substrate by an inductively coupled plasma-chemical vapor deposition (ICP-CVD) method at a process pressure of about $10^{-4}$ Torr and a process temperature of about 400° C.

Figure 3A:
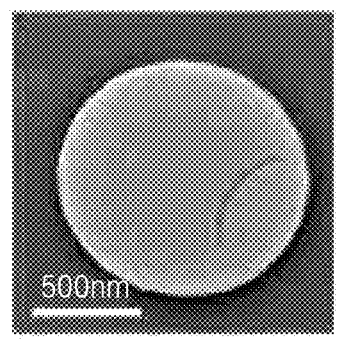
FIGS. 3A to 3D are diagrams showing an atomic structure of a boron nitride layer according to an embodiment.
Figure 3B:
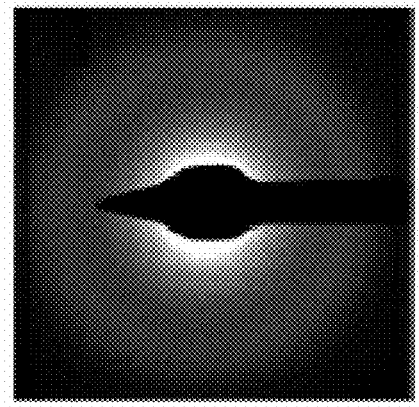
Figure 3C:
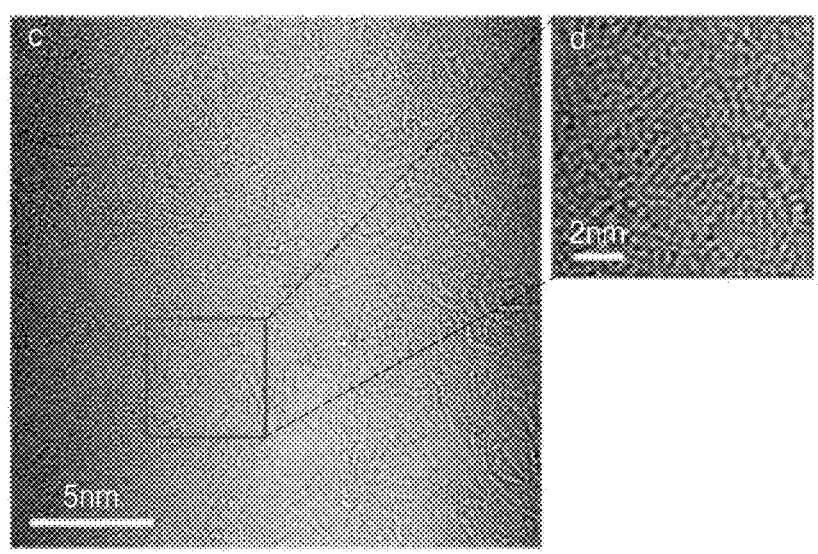
Figure 3D:
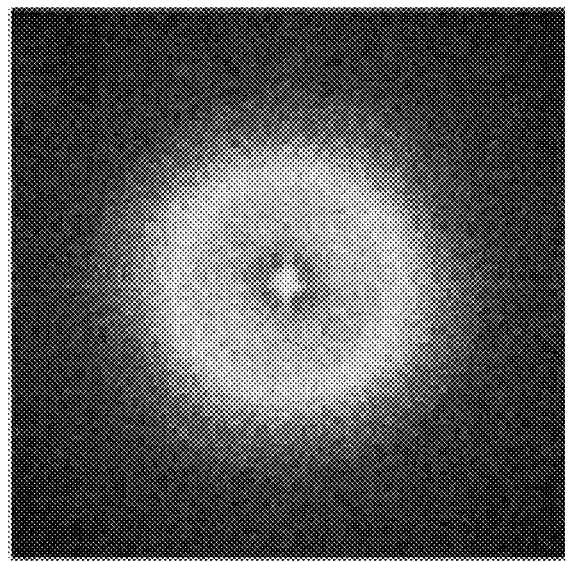

FIGS. 3A to 3D are diagrams showing an atomic structure of a boron nitride layer according to an embodiment. FIG. 3A is a low magnification transmission electron microscopy (TEM) image of the boron nitride layer, and FIG. 3B is an image of selective area electron diffraction of the boron nitride layer. The image of FIG. 3B shows a diffusion pattern with no discernible crystalline rings. FIG. 3C is a high magnification TEM image of the boron nitride layer in which atoms of the boron nitride layer are arranged in disorder. In addition, FIG. 3D is a diagram showing a fast Fourier transform result for the boron nitride layer and shows a typical diffusion diffraction pattern of an amorphous film. Therefore, it may be confirmed that the boron nitride layer fabricated by the fabricating method according to an embodiment is amorphous.

Figure 4A:
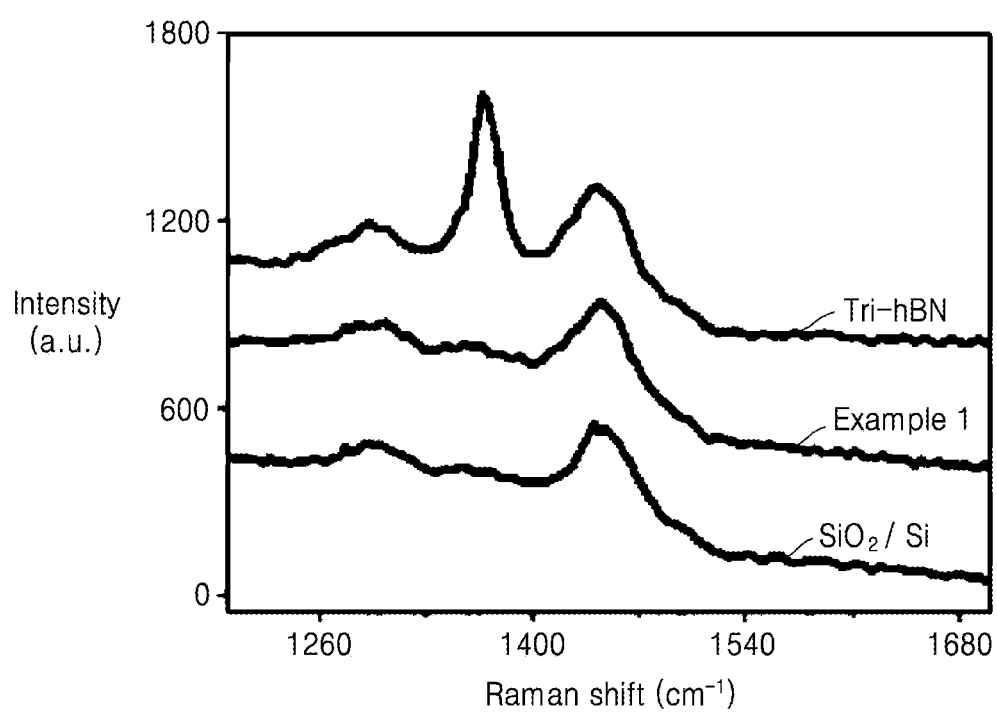
FIG. 4A is a Raman spectrum result with regard to a boron nitride layer according to an embodiment.

FIG. 4A is a Raman spectrum result of a boron nitride layer according to an embodiment. SiO$_2$/Si is a Raman spectrum result measured with respect to a substrate itself, for example, a substrate including SiO$_2$/Si, and Example 1 is a Raman spectrum result measured after forming the boron nitride layer a-BN according to an embodiment on the substrate including SiO$_2$/Si, and Tri-hBN is a Raman spectrum result measured after epitaxially growing a three-layer hexagonal boron nitride layer on the substrate including SiO$_2$/Si.

As shown in FIG. 4A, the Raman spectrum of the substrate and the Raman spectrum of the boron nitride layer according to an embodiment are similar to each other. When comparing the amorphous boron nitride layer a-BN according to an embodiment and the three-layer hexagonal boron nitride layer Tri-hBN, it may be confirmed that a peak present in the three-layer hexagonal boron nitride layer Tri-hBN at 1373 cm$^{-1}$ is not present in the amorphous boron nitride layer a-BN. This may mean that the boron nitride layer a-BN according to an embodiment does not have crystallinity included in the hexagonal boron nitride layer Tri-hBN.

Figure 4B:
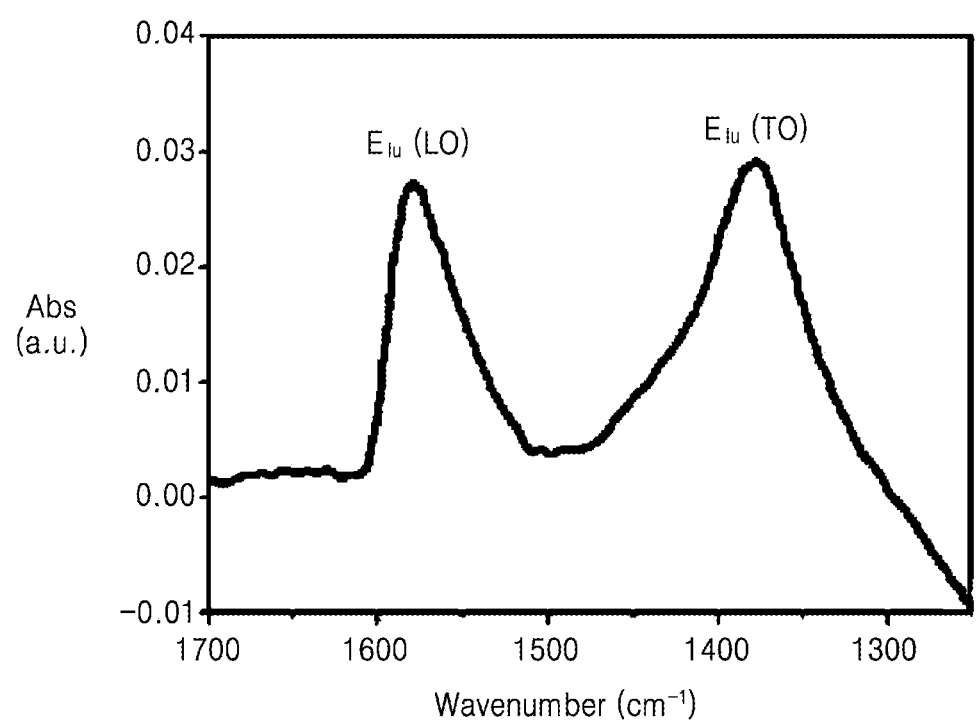
FIG. 4B shows a Fourier transform infrared spectroscopy (FTIR) spectrum result with regard to a boron nitride layer according to an embodiment.

FIG. 4B shows a Fourier transform infrared spectroscopy (FTIR) spectrum result of a boron nitride layer according to an embodiment. FTIR spectrum of the boron nitride layer is measured using s-polarised radiation at an incident angle of 60°. As shown in FIG. 4B, it may be confirmed in the boron nitride layer according to an embodiment that there is an absorption peak near 1370 cm$^{-1}$ that is attributed to a transverse optical mode, whereas there is another absorption peak near 1570 cm$^{-1}$. The absence of a peak near 1570 cm$^{-1}$ means that the boron nitride layer according to an embodiment has amorphous properties.

According to various experimental results, it may be confirmed that the boron nitride layer formed at a process temperature of about 400° C. is amorphous. Hereinafter, the boron nitride layer formed by using the fabricating method according to an embodiment at the process temperature of about 400° C. is referred to as the amorphous boron nitride layer a-BN.

Figure 5:
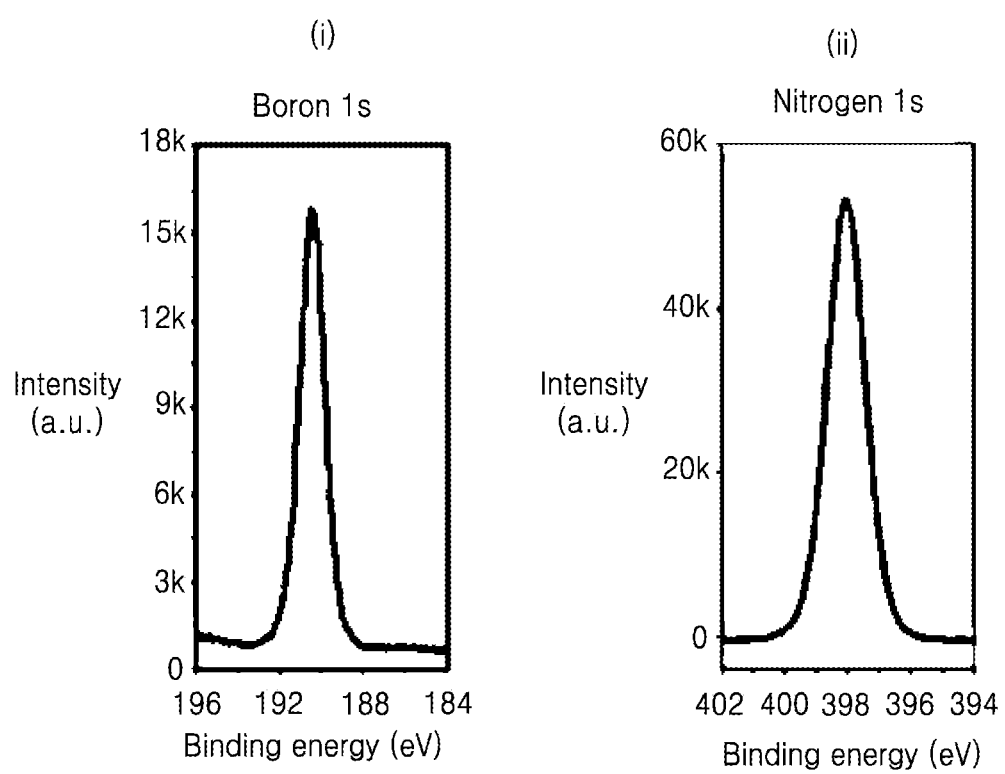
FIG. 5 is a diagram illustrating an X-ray photoelectron spectroscopy (XPS) profile result with regard to an amorphous boron nitride layer according to an embodiment.

FIG. 5 is a diagram illustrating an X-ray photoelectron spectroscopy (XPS) profile result of the amorphous boron nitride layer a-BN according to an embodiment. As shown in FIG. 5, it may be confirmed that peaks of 1s of boron and 1s of nitrogen are 190.4 eV and 397.9 eV, respectively. It may be confirmed from the XPS profile of FIG. 5 that the atom ratio of boron and nitrogen is about 1:1.08 based on the size of the peak of each of boron and nitrogen and includes a sp$^2$ combination.

Figure 6:
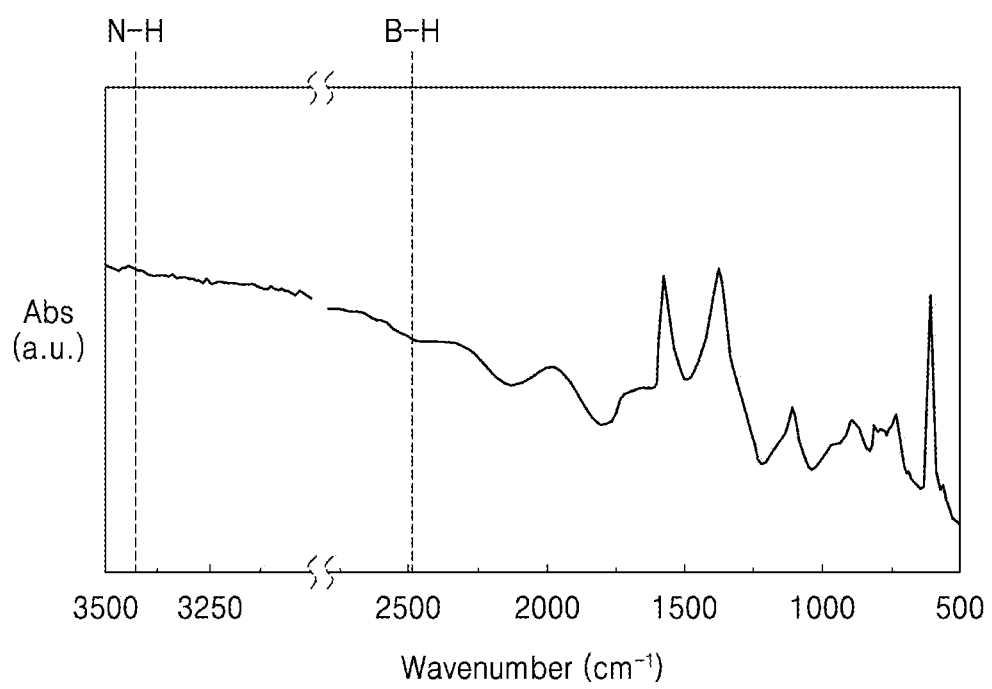
FIG. 6 shows a FTIR spectrum result with regard to an amorphous boron nitride layer according to an embodiment.

FIG. 6 shows a FTIR spectrum result of the amorphous boron nitride layer a-BN according to an embodiment. As shown in FIG. 6, no peak was observed in the FTIR spectrum at frequencies corresponding to B—H and N—H.

Figure 7A:
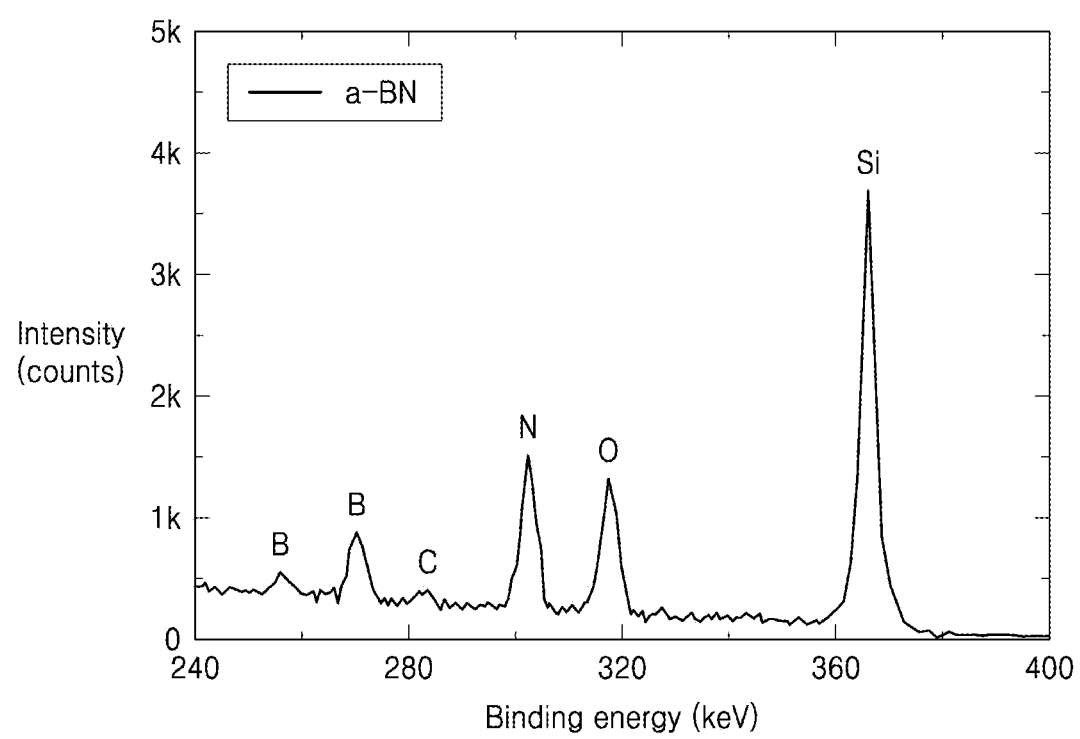
FIG. 7A shows a high-resolution Rutherford backscattering spectrometry (HR-RBS) profile result with regard to an amorphous boron nitride layer according to an embodiment.
Figure 7B:
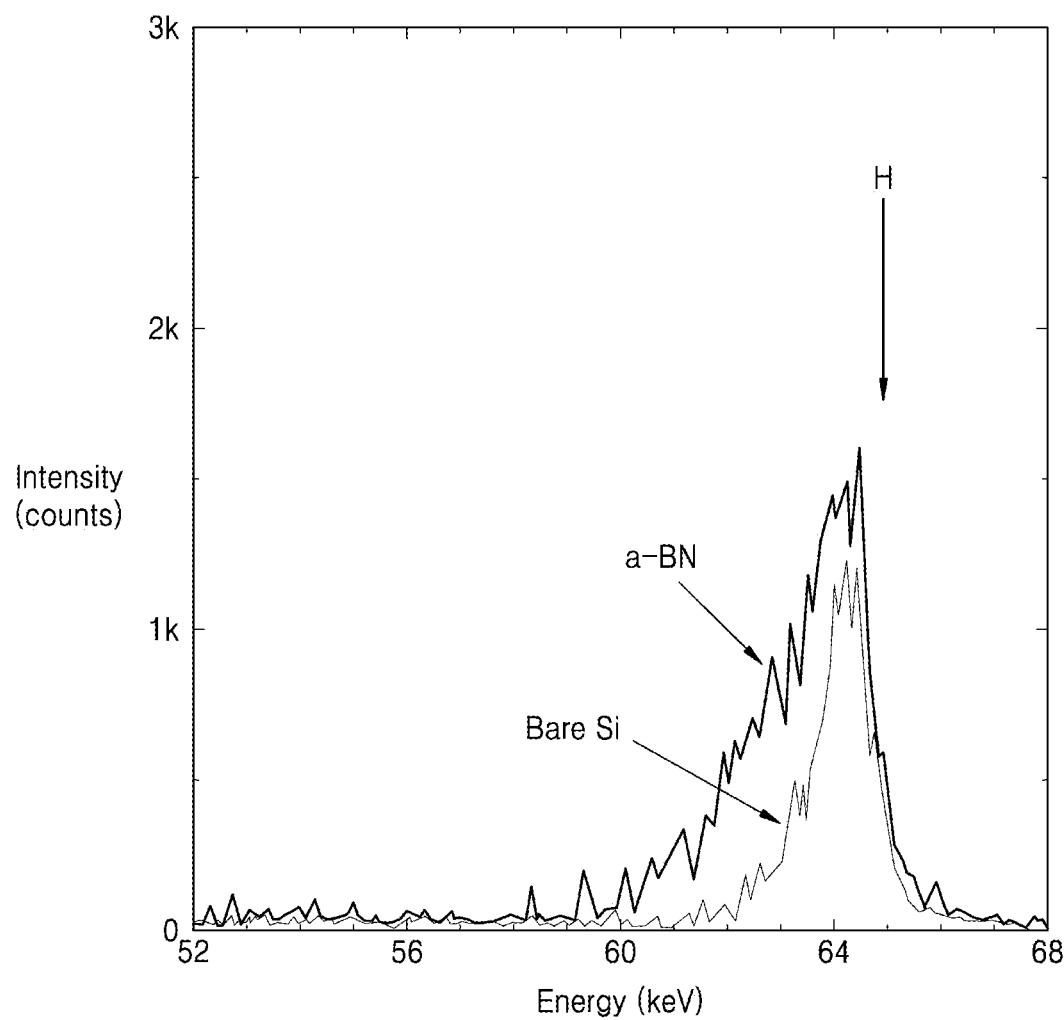
FIG. 7B shows a high-resolution elastic recoil detection analysis (HR-ERDA) profile result with regard to an amorphous boron nitride layer according to an embodiment.

FIG. 7A shows a high-resolution Rutherford backscattering spectrometry (HR-RBS) profile result for the amorphous boron nitride layer a-BN according to an embodiment, and FIG. 7B shows a high-resolution elastic recoil detection analysis (HR-ERDA) profile result for the amorphous boron nitride layer a-BN according to an embodiment. FIG. 7A shows the result measured within the energy range of 240-400 keV and FIG. 7B shows the result measured within the energy range of 52-68 keV, wherein it may be seen that Si and O which are atoms of a substrate were measured and B and N which are atoms of a boron nitride layer were measured. In addition, it may be seen that hydrogen was measured.

Figure 7C:
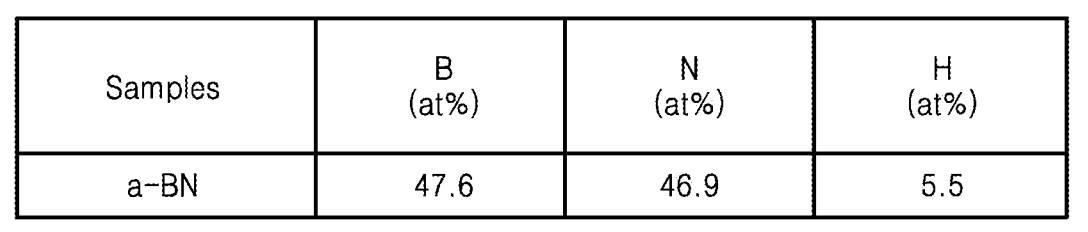

FIG. 7C shows a composition ratio of a boron nitride layer calculated using HR-RBS and HR-ERDA spectra. As shown in FIG. 7C, it may be confirmed that the ratio of boron and nitrogen is about 1.04:1. In addition, it may be confirmed that hydrogen in the boron nitride layer is about 5.5%.

The properties of the boron nitride layer grown on a substrate are confirmed above. The boron nitride layer according to an embodiment may be grown on a substrate including a catalyst material and then transferred to another substrate.

Figure 8A:
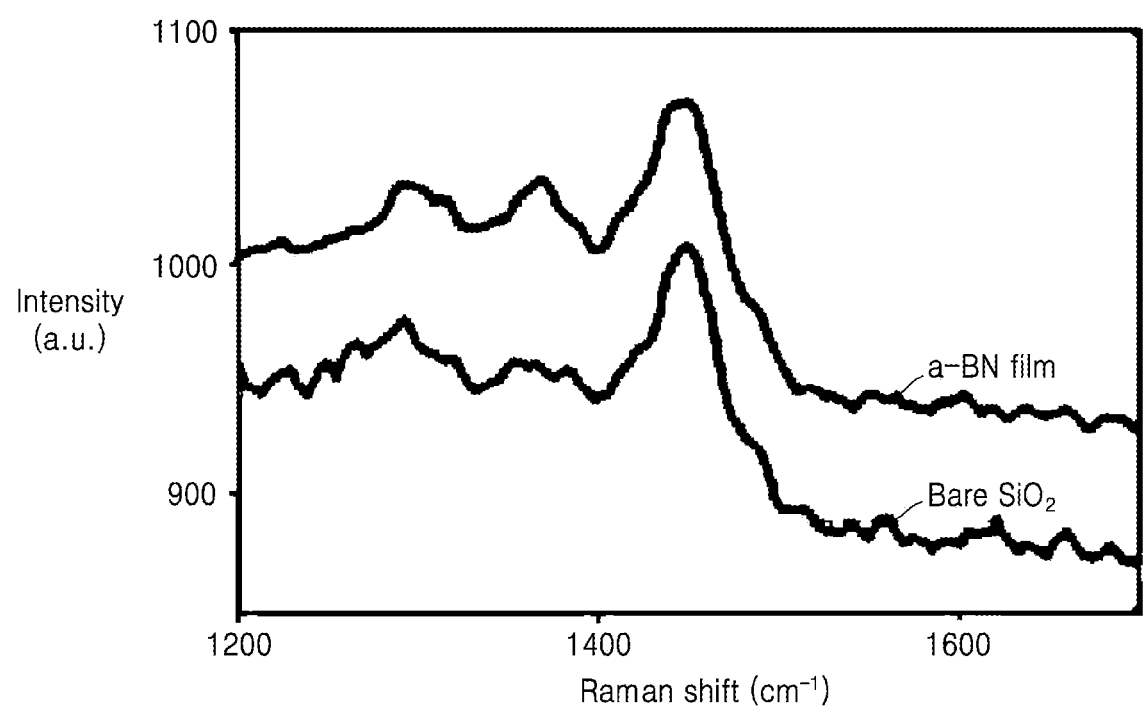
FIG. 8A shows a Raman spectrum result with regard to a boron nitride layer transferred to a substrate according to an embodiment.
Figure 8B:
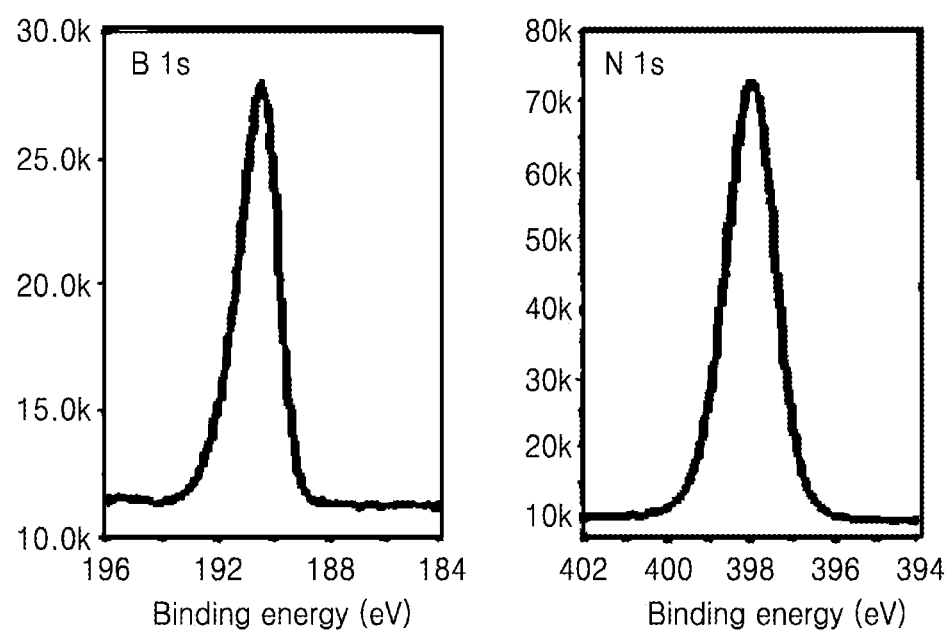
FIG. 8B is an XPS image of a transferred boron nitride layer according to an embodiment.

FIGS. 8A and 8B are diagrams illustrating the properties of a transferred boron nitride layer according to an embodiment. FIG. 8A shows a Raman spectrum result of the boron nitride layer transferred to a SiO$_2$ substrate according to an embodiment. The boron nitride layer is grown on a copper foil at a plasma power of about 30 W and a growth temperature of about 300° C. Then, the grown boron nitride layer was transferred to the SiO$_2$ substrate, and then a Raman spectrum was obtained. It may be confirmed that the Raman spectrum of the SiO$_2$ substrate on which the boron nitride layer is not grown and the Raman spectrum of the transferred boron nitride layer are similar. This may confirm that the transferred boron nitride layer is also amorphous like the SiO$_2$ substrate.

FIG. 8B is an XPS image of a transferred boron nitride layer according to an embodiment. As shown in FIG. 8B, it may be confirmed that peaks of 1s of boron and 1s of nitrogen are 190.4 eV and 397.9 eV, respectively, in the same manner as the boron nitride layer grown at the process temperature of about 400° C. It may be confirmed from the XPS profile of FIG. 8B that the atom ratio of boron and nitrogen is about 1:1.08 based on the size of the peak of each of boron and nitrogen and includes a sp$^2$ combination. Therefore, it may be confirmed that even when the growth substrate is a catalyst substrate, the amorphous boron nitride layer a-BN may be obtained by growing the boron nitride layer at a low temperature.

The dielectric properties of the amorphous boron nitride layer a-BN are described below. The dielectric constant is a physical measure of how easily electric dipoles may be induced in materials by application of an electrical field. The dielectric constant of air or vacuum is 1, but electric polarizability in solid state matter arises from dipolar, atomic and electronic components that are most relevant for high performance electronics. The contributions from these may be measured as a function of frequencies ranging from about 10-kHz to about 30-MHz. The dielectric constant may be measured using capacitance-frequency measurements on metal-insulator-metal (MIM) structures. The relative dielectric constants for the amorphous boron nitride layer a-BN and a hexagonal boron nitride layer h-BN were measured, for comparison, at different frequencies.

Figure 9A:
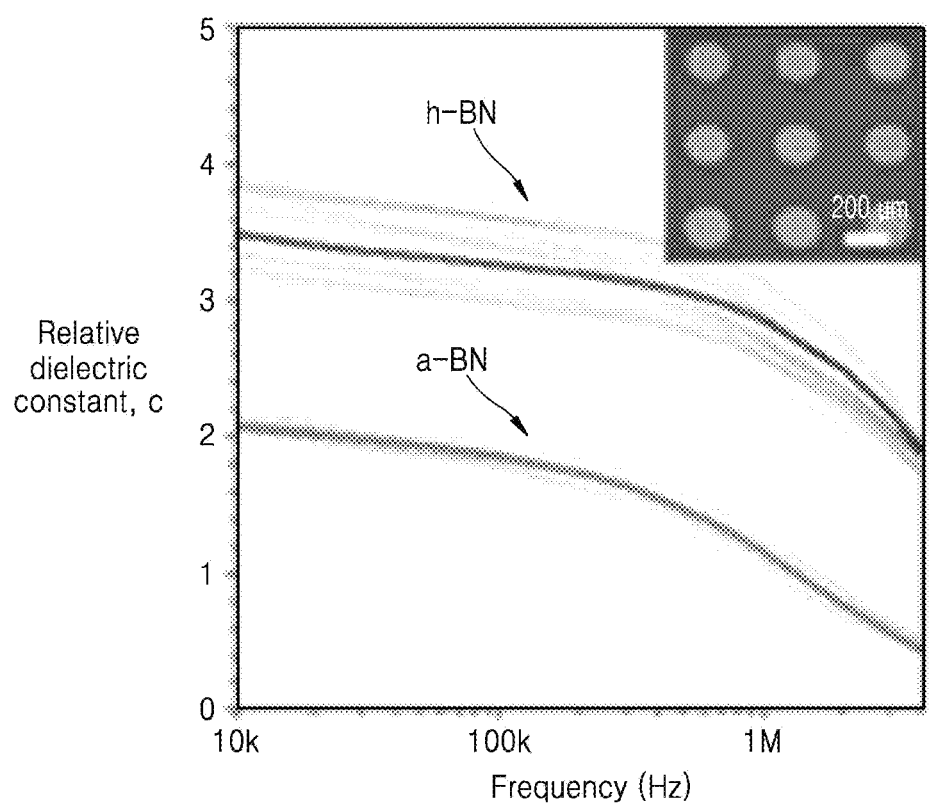
FIG. 9A shows a result of measuring dielectric constant of an amorphous boron nitride layer according to an embodiment.

FIG. 9A shows a result of measuring a dielectric constant of the amorphous boron nitride layer a-BN according to an embodiment. The dielectric constant shown in FIG. 9A is an average value of dielectric constants measured more than 50 times. As shown in FIG. 9A, the dielectric constants of the amorphous boron nitride layer a-BN and the hexagonal boron nitride layer h-BN may be inversely proportional to the operating frequency. It may be confirmed that the dielectric constants of the amorphous boron nitride layer a-BN and the hexagonal boron nitride layer h-BN are about 2 and 3.5, respectively, at an operating frequency of about 10 kHz. It may be confirmed that the dielectric constants of the amorphous boron nitride layer a-BN and the hexagonal boron nitride layer h-BN are about 1.78 and 3.28, respectively, at an operating frequency of about 100 kHz. It may be confirmed that the dielectric constant of the amorphous boron nitride layer a-BN at 1 MHz frequency reduces to about 1.16, which is close to the dielectric constant of air or vacuum. This is because the low dielectric constant of the amorphous boron nitride layer a-BN is attributed to nonpolar bonds between BN and also absence of order that limits and/or prevents dipole alignment even at a high frequency.

A refractive index n of a boron nitride layer may be measured using a spectroscopic ellipsometry (SE) measurement method and a dielectric constant k thereof may be obtained using the relationship of the refractive index n and the dielectric constant k is that $n^2=k$.

Figure 9B:
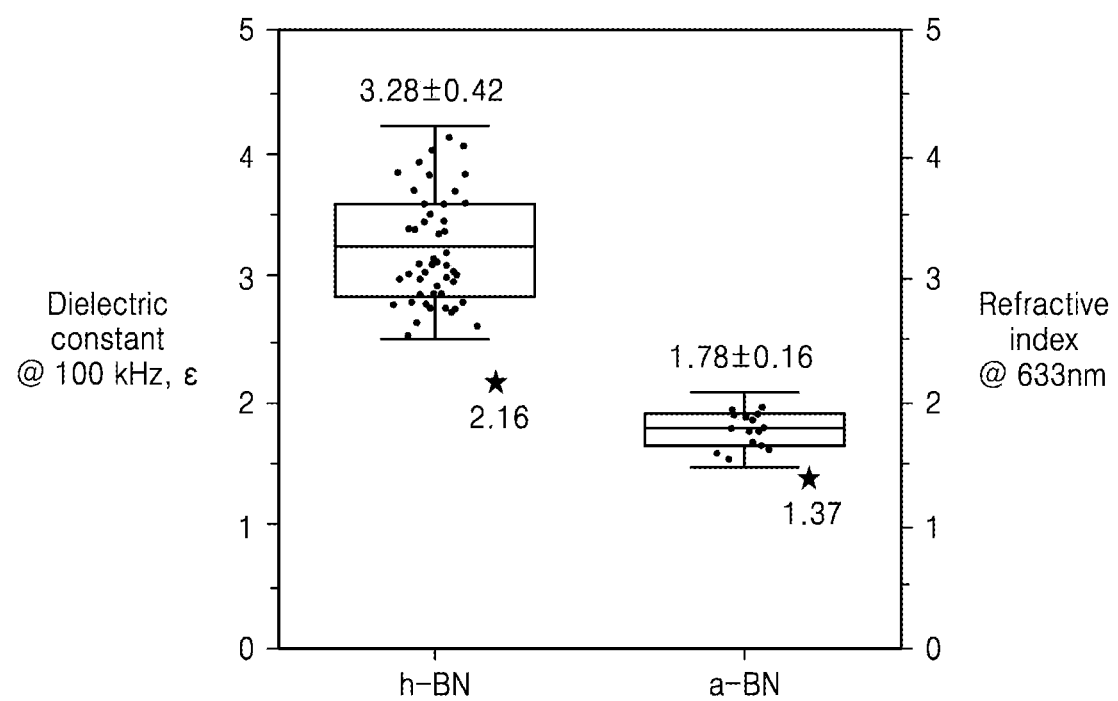
FIG. 9B shows a result with regard to a dielectric constant of a boron nitride layer obtained by using a spectroscopic ellipsometry (SE) measurement method.

FIG. 9B shows a result of a dielectric constant of a boron nitride layer using the SE measurement method. The refractive indices of the hexagonal boron nitride layer h-BN and the amorphous boron nitride layer a-BN at 633 nm wavelength using the SE measurement method were 2.16 and 1.37, respectively. Thus, it may be confirmed that the dielectric constants for the hexagonal boron nitride layer h-BN and the amorphous boron nitride layer a-BN are 4.67 and 1.88, respectively, and are closely identical to values obtained with electrical measurements at 100 kHz.

Figure 10A:
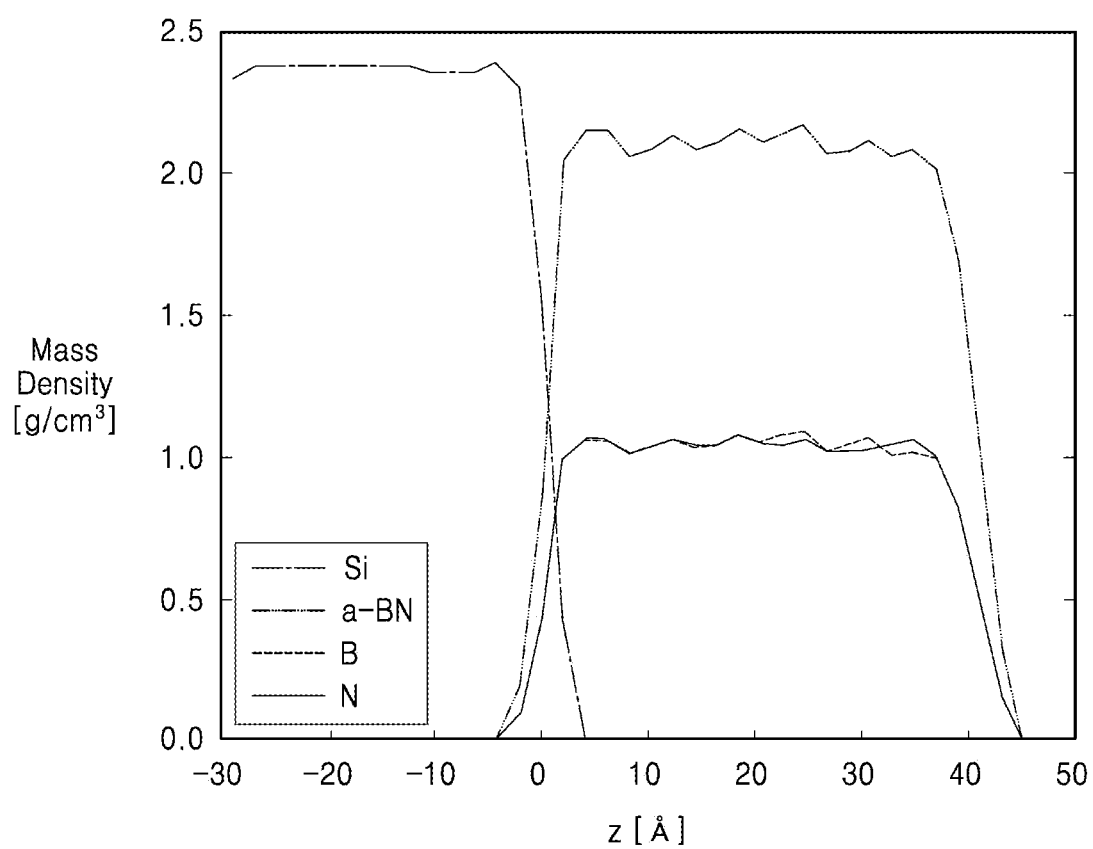
FIG. 10A is a simulation result with regard to a mass density of an amorphous boron nitride layer according to an embodiment.

FIG. 10A is a result of simulating a mass density of the amorphous boron nitride layer a-BN according to an embodiment. The amorphous boron nitride layer a-BN having a thickness of 40 nm was grown on a Si substrate, and then the mass density was simulated along the z direction which is the thickness direction of the amorphous boron nitride layer a-BN on the Si substrate. As shown in FIG. 10A, it may be confirmed that the mass density of the amorphous boron nitride layer a-BN is about 2 g/cm$^3$. It may be seen that the amorphous boron nitride layer a-BN has a low dielectric constant and a high density such that mechanical strength does not deteriorate.

Figure 10B:
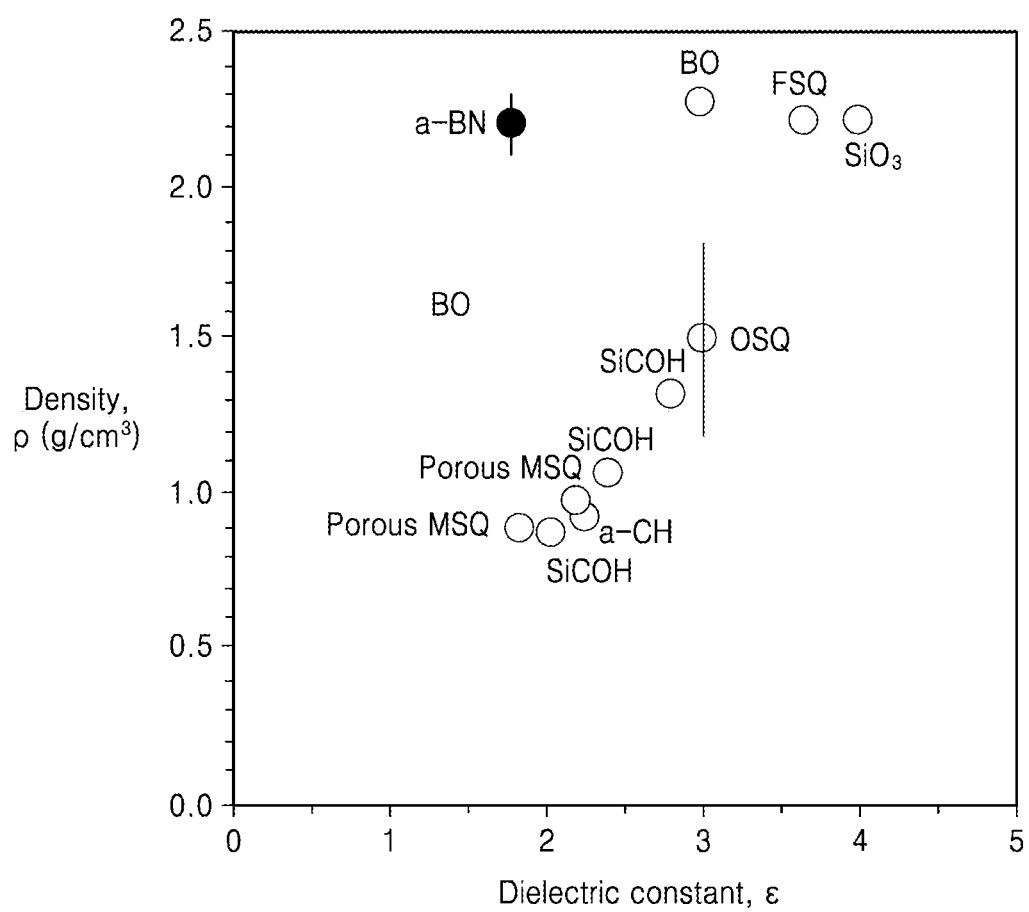
FIG. 10B is a graph showing the relationship between the dielectric constant and mass density of various materials.

FIG. 10B is a graph showing the relationship between the dielectric constant and mass density of various materials. As shown in FIG. 10B, the dielectric constant and the mass density of a material are generally proportional. Thus, a material having a low dielectric constant may have a low mass density and a low mechanical strength. However, the amorphous boron nitride layer a-BN having the dielectric density of about 2 has the mass density of about 2 which is relatively higher than other materials. Thus, the amorphous boron nitride layer a-BN may have a high mechanical strength.

Meanwhile, as another method of implementing low dielectric materials, in order to utilize a low dielectric constant of air, the materials are made porous. However, this may decrease the density of the material, which in turn results in poor mechanical strength. However, the amorphous boron nitride layer a-BN has good mechanical strength because the amorphous boron nitride layer a-BN is not porous as shown in FIGS. 3A to 3D described above. At least one pore may be formed in the amorphous boron nitride layer a-BN. Pores may be formed in the amorphous boron nitride layer a-BN, and thus the dielectric constant may be further lowered. In some cases, other materials may be filled in the pores of the amorphous boron nitride layer a-BN. Even if the pores of the amorphous boron nitride layer a-BN are filled with other materials, the utilization of the amorphous boron nitride layer a-BN may increase without significantly increasing the dielectric constant.

Figure 11:
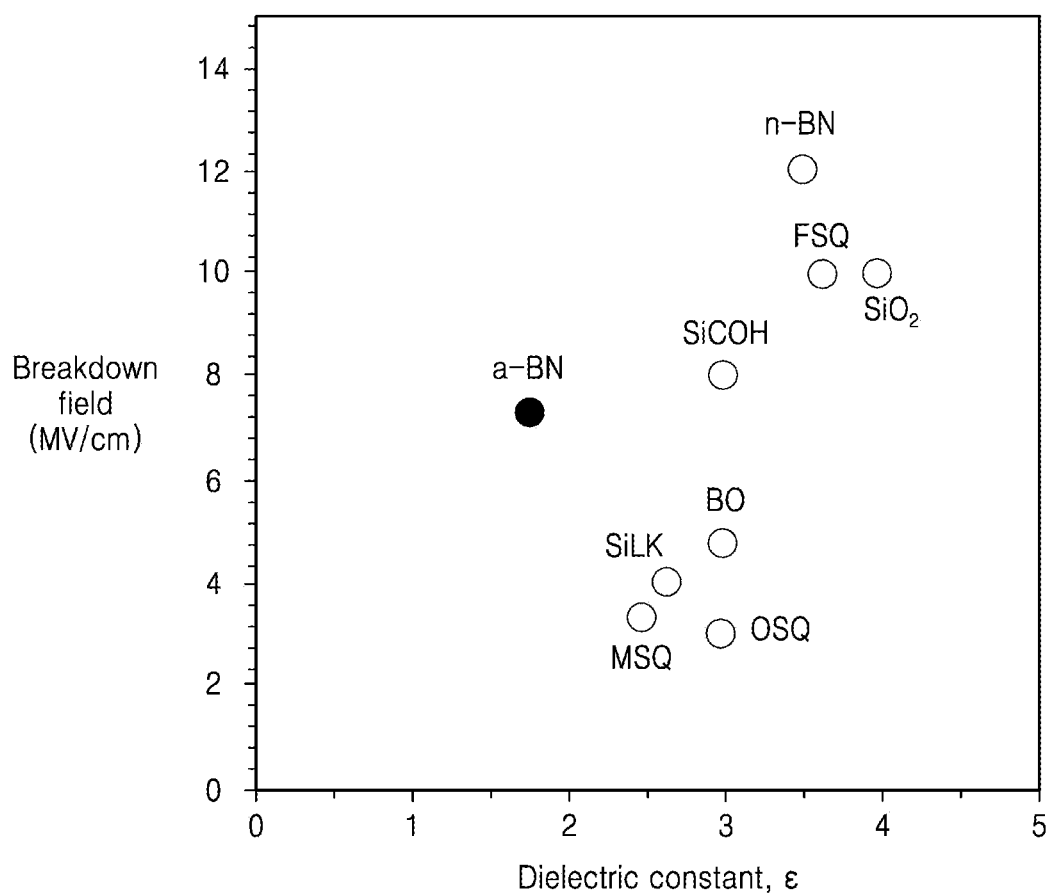
FIG. 11 is a graph showing the relationship between dielectric constants and breakdown fields of various materials.

FIG. 11 is a graph showing the relationship between dielectric constants and breakdown fields of various materials. As shown in FIG. 11, it may be confirmed that the dielectric constants and the breakdown fields are in a proportional relationship. As shown in FIG. 11, it may be confirmed that the breakdown field of the amorphous boron nitride layer a-BN is higher than that of other materials having a dielectric constant close to 2.

FIG. 12 is a table summarizing the properties of the amorphous boron nitride layer a-BN and a hexagonal boron nitride layer according to an embodiment. As indicated in FIG. 12, it may be confirmed that the amorphous boron nitride layer a-BN has a dielectric constant of 2 or less at an operating frequency of 100 kHz or less. In addition, the breakdown field of the amorphous boron nitride layer a-BN is 7.3 MV·cm$^{-1}$, which is much larger than that of the hexagonal boron nitride layer, and the reflection index for electromagnetic waves of 633 nm is also 2 or less.

The amorphous boron nitride layer a-BN may be used as an interlayer insulating layer because of the electrical and dielectric properties as described above. In particular, when the amorphous boron nitride layer a-BN is used as the interlayer insulating layer between conductive materials, parasitic capacitance may be reduced.

In addition, since the amorphous boron nitride layer a-BN is chemically stable, the amorphous boron nitride layer a-BN may be used as a diffusion barrier.

For example, a key step in back end of line (BEOL) CMOS fabrication of logic and memory devices is the deposition of the diffusion barrier between a low dielectric material and metal wire interconnects to limit and/or prevent metal atom migration into an insulator. Ideally, if the low dielectric material may also serve as the diffusion barrier, it may be unnecessary to deposit a separate diffusion barrier. The amorphous boron nitride layer a-BN according to an embodiment may be used as the diffusion barrier because of its low dielectric constant and large breakdown field.

Figure 13:
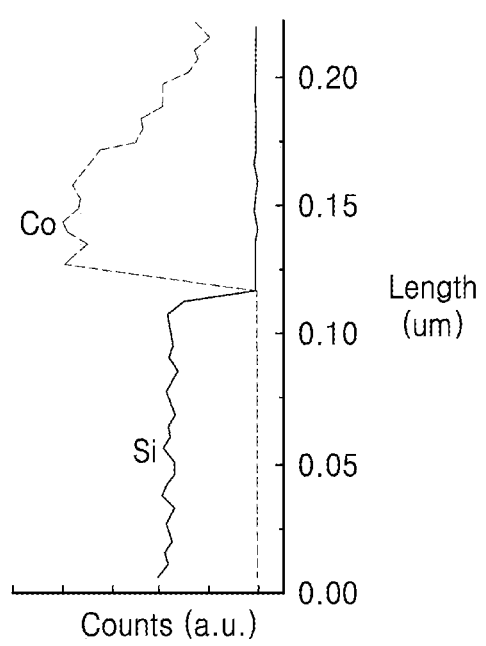
FIG. 13 is an energy dispersive spectroscopy (EDS) line profile after a thermal diffusion test for an amorphous boron nitride layer according to an embodiment.

FIG. 13 is an energy dispersive spectroscopy (EDS) line profile after a thermal diffusion test for the amorphous boron nitride layer a-BN according to an embodiment. The amorphous boron nitride layer a-BN having a thickness of 3 nm was formed on a Si substrate and a cobalt layer of 80 nm was deposited on the amorphous boron nitride layer a-BN according to an embodiment. The diffusion barrier properties of the amorphous boron nitride layer a-BN were tested by annealing Co/a-BN/Si devices in vacuum for 1 hour at 600° C.

As shown in FIG. 13, it may be confirmed that a cobalt component and a silicon component are separated according to the height of the thickness. This means that the cobalt component does not diffuse into a silicon region. It may be seen that the amorphous boron nitride layer a-BN serves as a diffusion barrier.

Figure 14I:
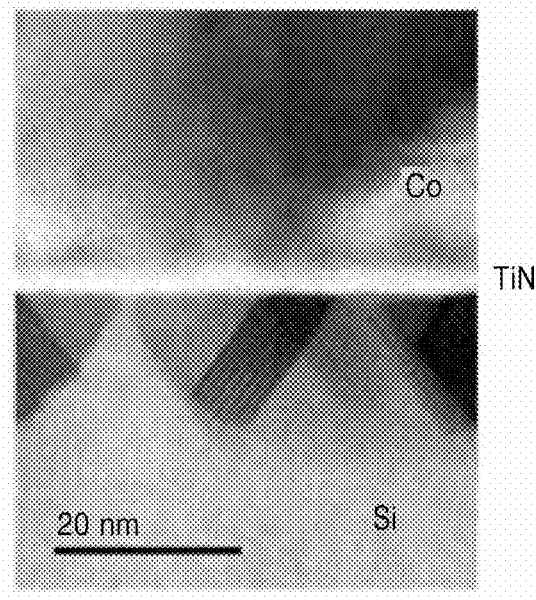
FIG. 14(i) is a cross-sectional transmission electron microscope (TEM) image and FIG. 14(ii) an EDS line profile after a heat diffusion test for a TiN layer as a comparative example.
Figure 14:
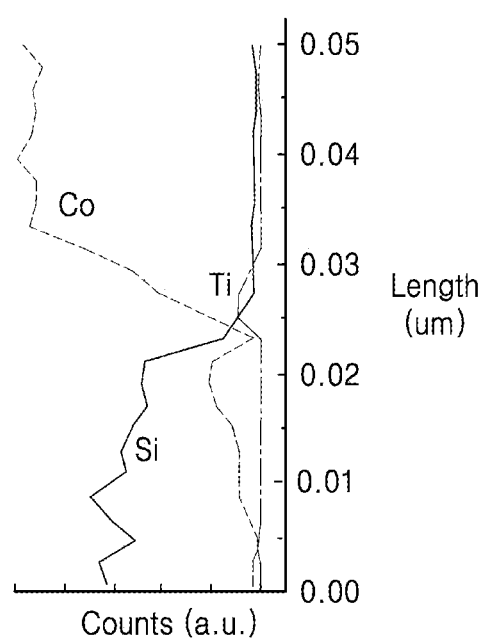

FIG. 14(i) is a cross-sectional TEM image and FIG. 14(ii) is an EDS line profile after a heat diffusion test for a TiN layer as a comparative example. The TiN layer of a thickness of 3 nm was formed on a silicon substrate, and a cobalt layer of 80 nm was deposited on the TiN layer. Then, Co/TiN/Si devices were annealed at 600° C. in vacuum for about 1 hour. As a result, as shown in FIG. 14(i) and FIG. 14(ii), it may be confirmed that cobalt was separated from the cobalt layer, and the separated cobalt was diffused to the silicon substrate.

It may be seen from the results of FIGS. 13, 14(i), 14(ii) that the amorphous boron nitride layer a-BN has a greater effect of limiting and/or preventing the diffusion of metal than the TiN layer which is generally used as a diffusion barrier.

Figure 15:
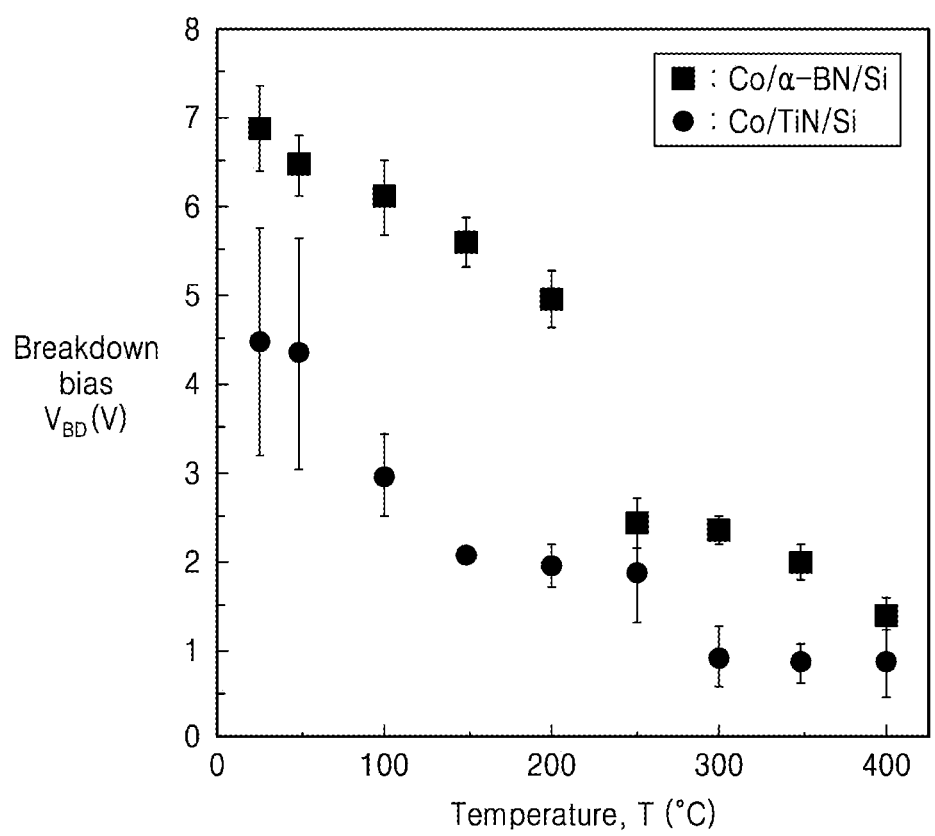
FIG. 15 is a result showing a breakdown bias according to the temperature of an amorphous boron nitride layer according to an embodiment.

FIG. 15 is a result showing a breakdown bias according to the temperature of the amorphous boron nitride layer a-BN according to an embodiment. It may be seen that the breakdown bias of the amorphous boron nitride layer a-BN is inversely proportional to the temperature. Although the breakdown voltage decreases as the temperature increases, it may be seen that the breakdown bias of the amorphous boron nitride layer a-BN is larger than the breakdown bias of a TiN layer. This means that the amorphous boron nitride layer a-BN is stable at various temperatures, and as a result, the amorphous boron nitride layer a-BN may be an excellent low-k material for high-performance CMOS electronic devices.

The boron nitride layer formed by using an inductively coupled plasma-chemical vapor deposition (ICP-CVD) method at a low temperature of 400° C. or less is amorphous and may perform a diffusion barrier function. In addition, the amorphous boron nitride layer a-BN has a low dielectric constant and has a large breakdown field compared to a material having a similar dielectric constant. The amorphous boron nitride layer a-BN is fabricated at a low temperature of 400° C. or less, and a process temperature may be adjusted depending on a substrate, pressure, etc. For example, when the substrate serves as a catalyst for forming the boron nitride layer, boron nitride layer may be formed at a temperature lower than 400° C., for example, 300° C.

A boron nitride layer formed at a temperature higher than 400° C. will be described below. For example, the boron nitride layer was grown on a silicon substrate by using the ICP-CVD method at a process pressure of about $10^{-4}$ Torr and a process temperature of about 700° C.

Figure 16A:
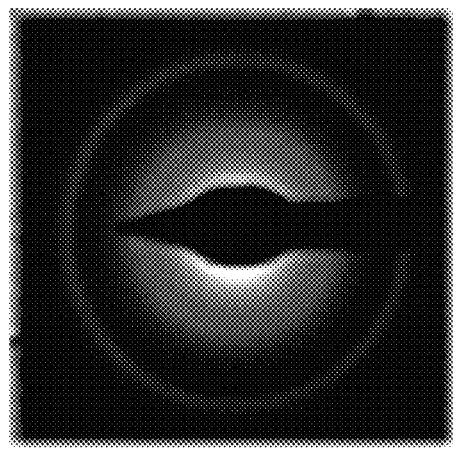
FIG. 16A is an image of selective area electron diffraction of a boron nitride layer grown at about 700° C. according to an embodiment.
Figure 16B:
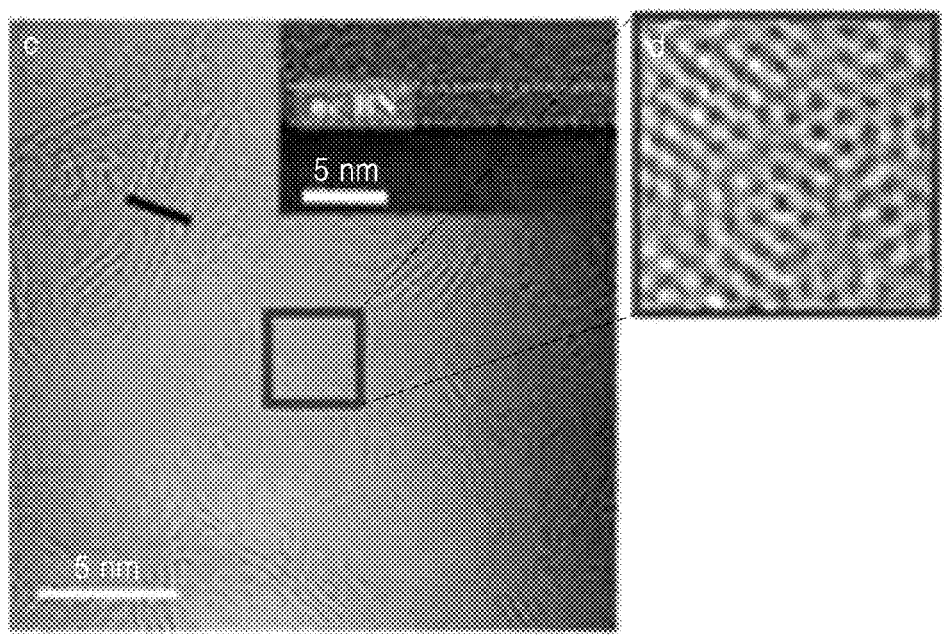
FIG. 16B is a high magnification TEM image of a boron nitride layer grown at about 700° C. according to an embodiment.
Figure 16C:
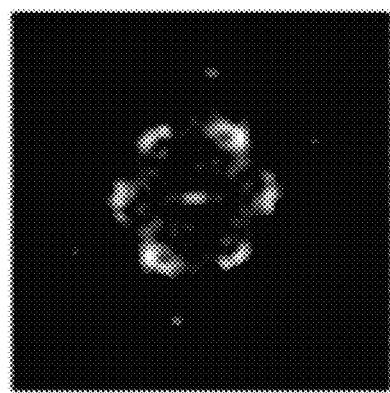
FIG. 16C shows a fast Fourier transform result for a boron nitride layer grown at about 700° C. according to an embodiment.

FIGS. 16A to 16C are diagrams showing an atomic structure of a boron nitride layer grown at about 700° C. according to an embodiment. FIG. 16A is an image of the selective area electron diffraction of the boron nitride layer grown at about 700° C. The image of FIG. 16A shows a polycrystalline ring pattern. FIG. 16B is a high magnification TEM image of the boron nitride layer grown at about 700° C. wherein it may be confirmed that nano-sized small crystallites are arranged. In addition, FIG. 16C is a diagram showing a fast Fourier transform result for the boron nitride layer grown at about 700° C. wherein it may be confirmed that the boron nitride layer has a hexagonal superstructure. Therefore, it may be confirmed that the boron nitride layer grown at a temperature higher than about 400° C., for example, 700° C., includes nano-sized crystallites.

A nanocrystalline boron nitride layer nc-BN has good mechanical strength because the nanocrystalline boron nitride layer nc-BN is not porous, as shown in FIGS. 3A to 3D described above. One or more pore may be formed in the nanocrystalline boron nitride layer nc-BN according to an apparatus to which the nanocrystalline boron nitride layer nc-BN is applied. Pores may be formed in the nanocrystalline boron nitride layer nc-BN, and thus a dielectric constant may be further lowered. According to embodiments, other materials may be filled in the pores of the nanocrystalline boron nitride layer nc-BN. Even if the pores of the nanocrystalline boron nitride layer nc-BN are filled with other materials, the utilization of the nanocrystalline boron nitride layer nc-BN may increase without significantly increasing the dielectric constant.

Figure 17:
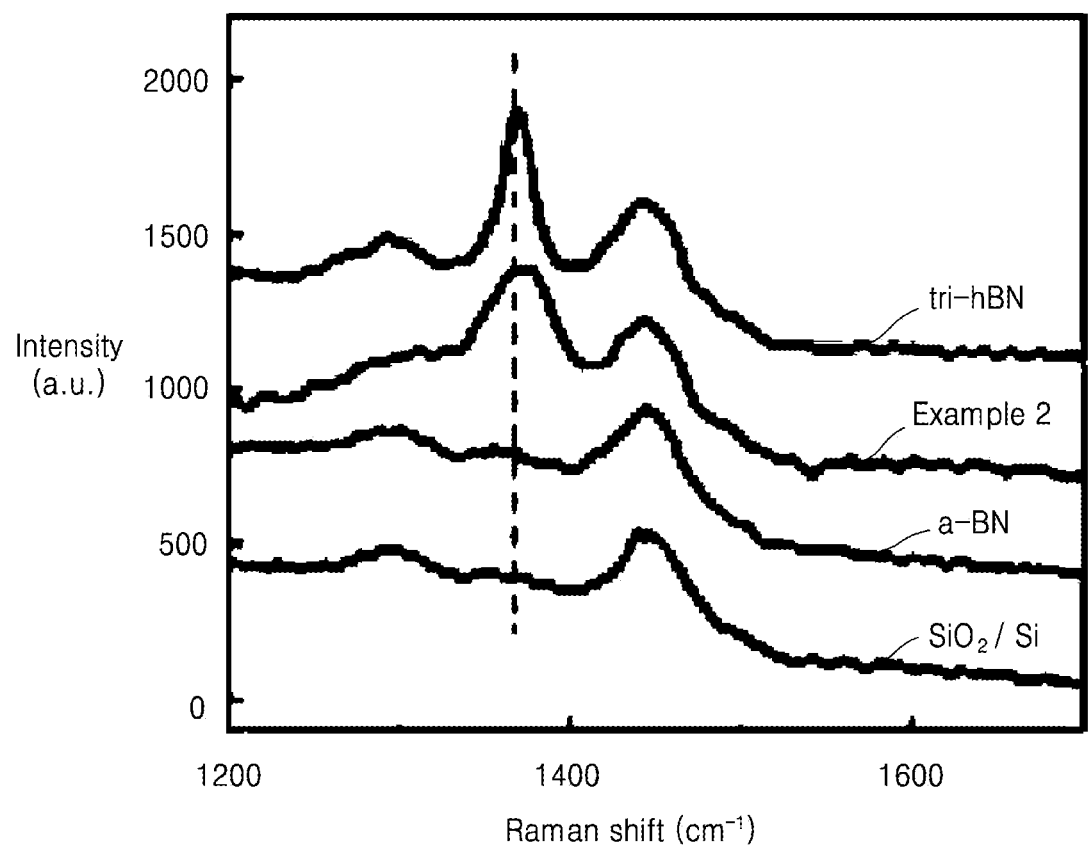
FIG. 17 is a Raman spectrum result with regard to a nanocrystalline boron nitride layer according to an embodiment.

FIG. 17 is a Raman spectrum result of the nanocrystalline boron nitride layer nc-BN according to an embodiment. As shown in FIG. 17, it may be confirmed that a peak is not present at a wavelength of about 1370 $cm^{-1}$ in a substrate including $SiO_2$/Si and the amorphous boron nitride layer a-BN, whereas a peak is present in Example 2 which is a boron nitride layer formed at 700° C. and the hexagonal boron nitride layer Tri-hBN at the wavelength of about 1370 $cm^{-1}$. It may be seen that the boron nitride layer formed at 700° C. has crystallinity. Hereinafter, the boron nitride layer having nano-sized crystallites is referred to as the nanocrystalline boron nitride layer nc-BN.

Figure 18:
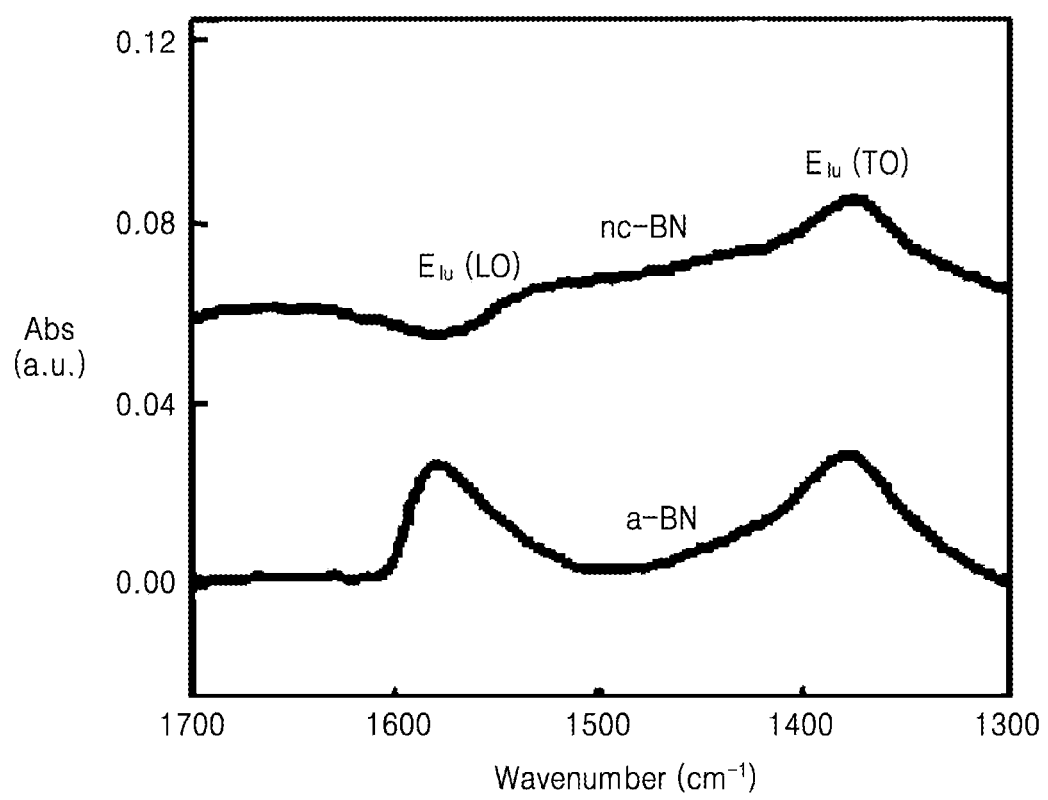
FIG. 18 shows a FTIR spectrum result with regard to a nanocrystalline boron nitride layer according to an embodiment.

FIG. 18 shows a FTIR spectrum result of the nanocrystalline boron nitride layer nc-BN according to an embodiment. FTIR spectrum of the boron nitride layer is measured using s-polarised radiation at an incident angle of 60°. As shown in FIG. 18, it may be confirmed in the nanocrystalline boron nitride layer nc-BN that there is an absorption peak near 1370 $cm^{-1}$ that is attributed to a transverse optical mode, whereas there is no absorption peak near 1570 $cm^{-1}$. This means that the nanocrystalline boron nitride layer nc-BN according to an embodiment does not have amorphous properties.

Figure 19:
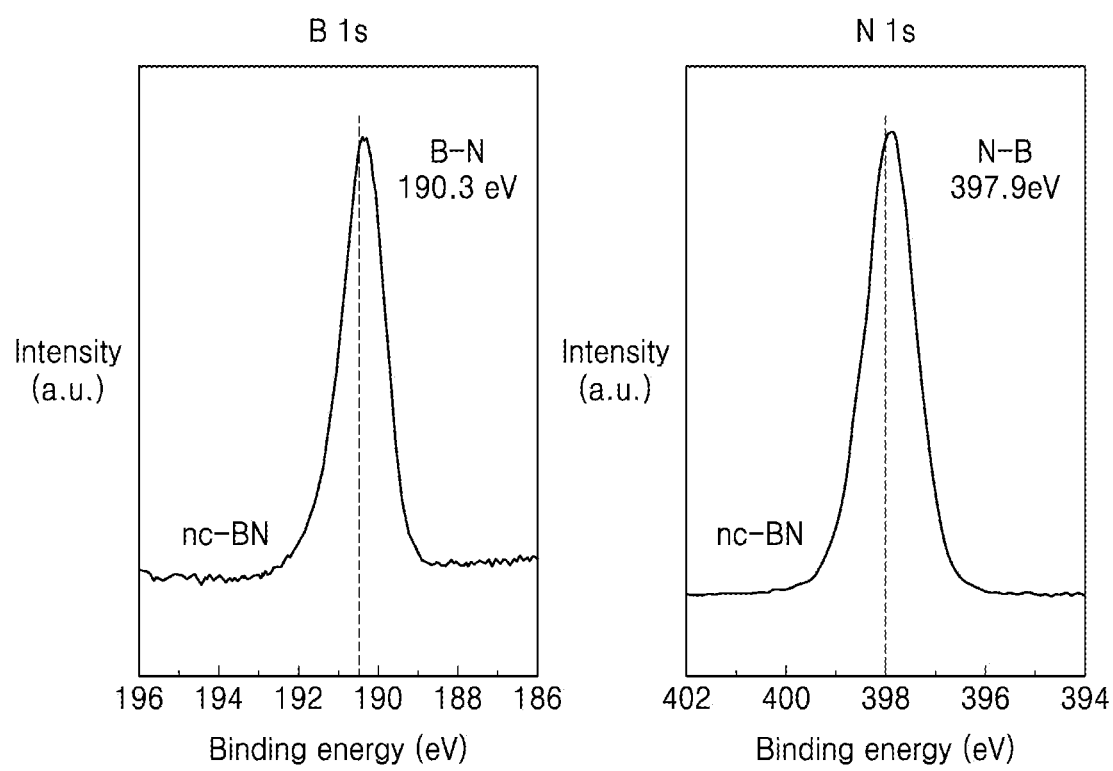
FIG. 19 is a diagram illustrating an XPS profile result with regard to a nanocrystalline boron nitride layer according to an embodiment.

FIG. 19 is a diagram illustrating an XPS profile result of the nanocrystalline boron nitride layer nc-BN according to an embodiment. As shown in FIG. 19, it may be confirmed that peaks of 1s of boron and 1s of nitrogen are 190.4 eV and 397.9 eV, respectively. It may be confirmed that the peaks of 1s of boron and 1s of nitrogen of the nanocrystalline boron nitride layer nc-BN and the amorphous boron nitride layer a-BN are almost identical. It may be confirmed from the XPS profile of FIG. 19 that the atom ratio of boron and nitrogen is about 1:1.08.

Figure 20:
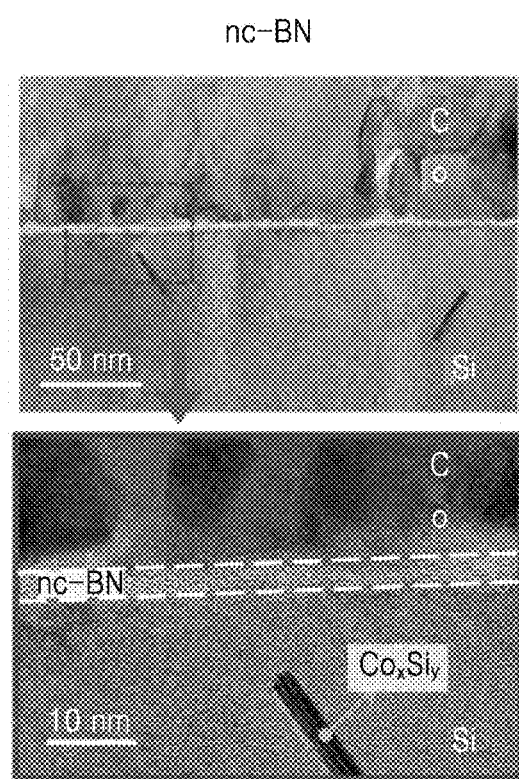
FIG. 20 is a diagram illustrating an example of using a nanocrystalline boron nitride layer as a diffusion barrier layer according to an embodiment.

FIG. 20 is a diagram illustrating an example in which the nanocrystalline boron nitride layer nc-BN is used as a diffusion barrier layer according to an embodiment. A boron nitride layer was grown on a silicon substrate at 700° C., and a cobalt layer of a thickness of 50 nm was deposited on the boron nitride layer. The boron nitride layer grown at 700° C. may be the nanocrystalline boron nitride layer nc-BN. Thereafter, the above-described structure was vacuum annealed at 600° C. for 1 hour. As shown in FIG. 20, a needle-shaped cobalt silicide of a very low density was observed on the silicon substrate. It may be confirmed that the nanocrystalline boron nitride layer nc-BN performed a function of a diffusion barrier even in an annealing condition.

Figure 21:
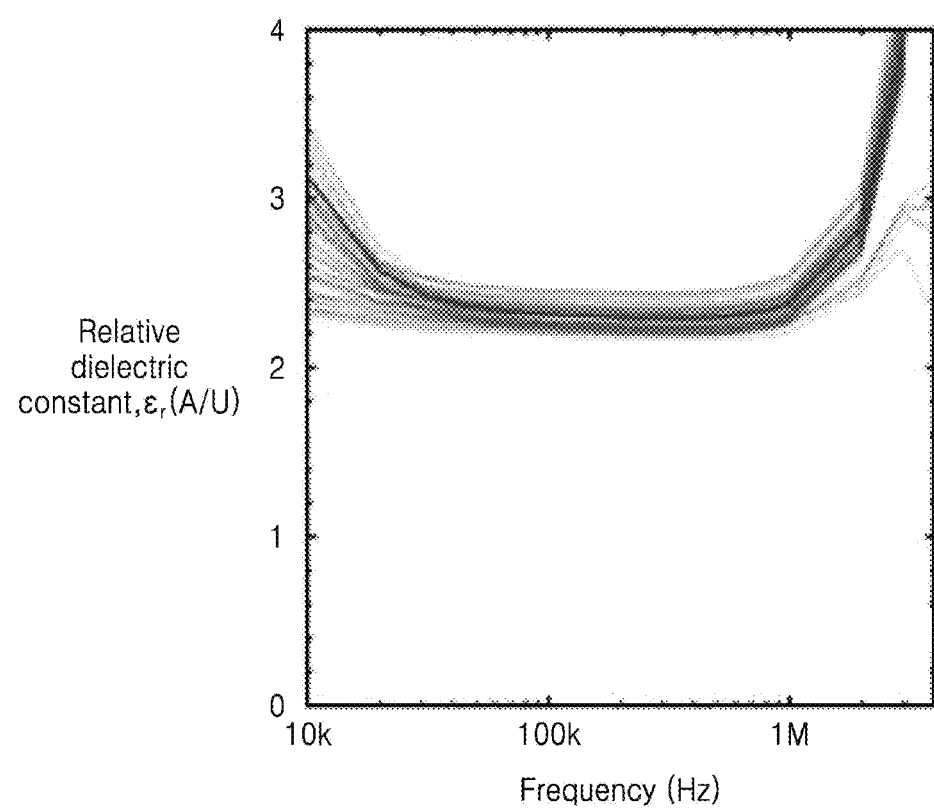
FIG. 21 is a graph showing a dielectric constant of a nanocrystalline boron nitride layer for each frequency according to an embodiment.

FIG. 21 is a graph showing a dielectric constant of the nanocrystalline boron nitride layer nc-BN for each frequency according to an embodiment. As shown in FIG. 21, it may be confirmed that in the operating frequency range of about 50 kHz to about 1 MHz, the nanocrystalline boron nitride layer nc-BN has a dielectric constant of 2.5 or less. For example, it may be confirmed that the nanocrystalline boron nitride layer nc-BN has a dielectric constant of about 2.3 to about 2.5. It may be confirmed that a crystalline hexagonal boron nitride generally has a dielectric constant of about 2.9 to about 3.8 in the operating frequency range of about 50 MHz to about 100 kHz, whereas the nanocrystalline boron nitride layer nc-BN has a low dielectric constant of 2.5 or less. As described above, the nanocrystalline boron nitride layer nc-BN may be used as an interlayer insulating layer because of its low dielectric constant. In particular, when the nanocrystalline boron nitride layer nc-BN is used as the interlayer insulating layer between conductive materials, parasitic capacitance may be reduced.

Even if the amorphous boron nitride layer a-BN itself is not porous, pores may be formed in the amorphous boron nitride layer a-BN depending on an apparatus to which the amorphous boron nitride layer a-BN is applied. Pores may be formed in the amorphous boron nitride layer a-BN, and thus the dielectric constant may be further lowered.

The amorphous boron nitride layer a-BN may have an energy band gap of about 6.00 eV or less. In general, it may be confirmed that a three-layer hexagonal boron nitride layer has an energy band gap of about 6.05 eV, while a boron nitride layer grown at 400° C. has an energy band gap of about 5.96 eV, and a boron nitride layer grown at 700° C. has an energy band gap of about 5.85 eV. That is, the amorphous boron nitride layer a-BN and/or the nanocrystalline boron nitride layer nc-BN has a lower energy band gap than the hexagonal boron nitride layer. Therefore, the amorphous boron nitride layer a-BN and/or the nanocrystalline boron nitride layer nc-BN is chemically stable.

Figure 22A:
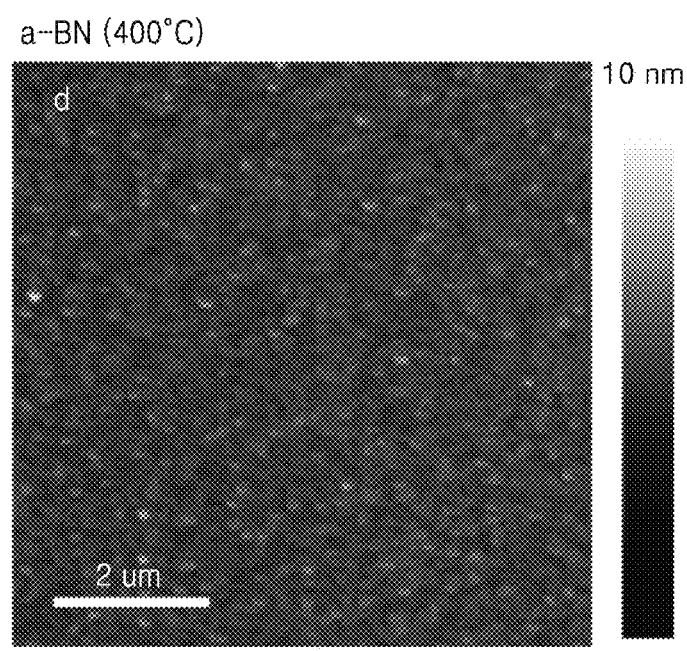
FIG. 22A is an atomic force microscope (AFM) image of a boron nitride layer grown at about 400° C.
Figure 22B:
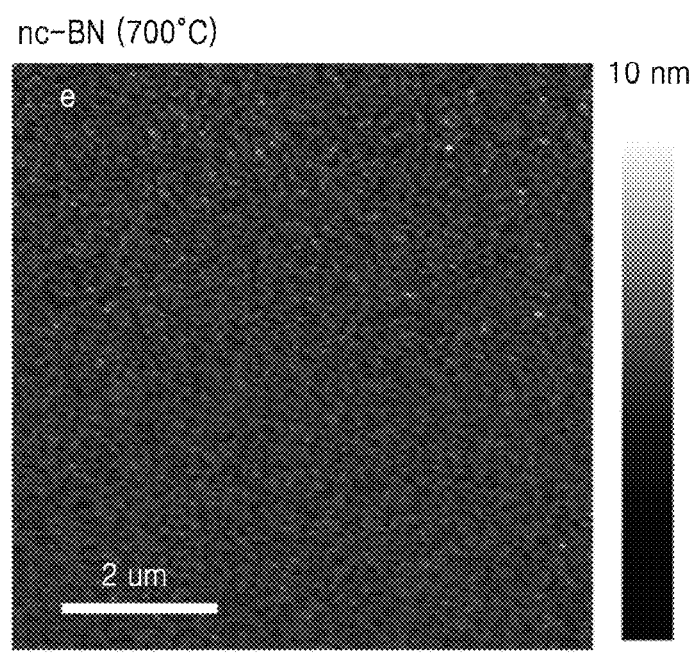
FIG. 22B is an AFM image of a boron nitride layer grown at about 700° C.

FIG. 22A is an atomic force microscope (AFM) image of the boron nitride layer BN grown at about 400° C., and FIG. 22B is an AFM image of a boron nitride layer grown at about 700° C. As shown in FIG. 22A, it was confirmed that the surface roughness of the boron nitride layer BN grown at about 400° C. is about 0.45 nm, and as shown in FIG. 22B, the surface roughness of the boron nitride layer grown at about 700° C. is about 0.39 nm. Because the surface of the amorphous boron nitride layer a-BN is smooth, it is easy to form another layer on the boron nitride layer BN, thereby facilitating manufacturing of an apparatus.

The amorphous boron nitride layer a-BN or the nanocrystalline boron nitride layer nc-BN according to an embodiment may be used as the interconnect structure 120. The processing and structures of the interconnect structure 120 may be applied to front-end-of-line (FEOL) semiconductor processing and structures, back end of line (BEOL) semiconductor processing and structures, or both.

FEOL is part of integrated circuit (IC) manufacturing where individual devices (e.g., transistors, capacitors, resistors, etc.) are patterned on the semiconductor substrate 112 or a layer. FEOL generally covers everything up to, (but not including), the deposition of metal interconnect layers. After the final FEOL operation, the result may typically be a wafer with isolated transistors (e.g., without any layers).

BEOL is a second part of IC manufacturing where the individual devices 110 (e.g., transistors, capacitors, resistors, etc.) are interconnected with layer on the wafer, e.g., a metallization layer or layers. BEOL may include contacts, the insulating layers 230 (dielectrics), metal levels, and bonding sites for chip-to-package connections. In the BEOL part of the manufacturing stage contacts (pads), interconnect layers, vias and dielectric structures may be formed. In recent IC processes, more than 10 metal layers may be added in BEOL.

FIG. 23 is a diagram schematically illustrating an electronic apparatus 100 including the interconnect structure 120 according to an embodiment.

Referring to FIG. 23, the electronic apparatus 100 may include device layers 110 and the interconnect structure 120 connecting the device layers 110.

The device layer 110 may include a substrate 112. For example, the substrate 112 may include a Group IV semiconductor material, a Group III/V semiconductor compound, or a Group II/VI semiconductor compound. As a specific example, the substrate 112 may include Si, Ge, SiC, SiGe, SiGeC, Ge Alloy, GaAs, InAs, InP, etc. However, these are merely examples and various other semiconductor materials may be used as the substrate 112.

The substrate 112 may include a single layer or a plurality of layers in which different materials are stacked. The substrate 112 may include, for example, a silicon-on-insulator (SOI) substrate or a silicon germanium-on-insulator (SGOI) substrate. In addition, the substrate 112 may include a non-doped semiconductor material or a doped semiconductor material.

The device layer 110 may include one or more semiconductor devices such as resistors, diodes, capacitors, and/or transistors. Although two transistors TR1 and TR2 are illustrated in the drawing, the present disclosure is not limited thereto. One or more semiconductor devices may be formed using techniques well known to those skilled in the art. Thus, the device layer 110 may include a memory device including a transistor, a capacitor, a diode, a resistor, etc., a display device, etc., and the electronic apparatus 100 may be a system memory, a memory apparatus, a display apparatus, a mobile apparatus, etc.

The interconnect structure 120 may be disposed on the device layer 110. The interconnect structure 120 may have a structure in which a plurality of metallization layers ML are stacked. The metallization layer ML may include a conductive layer 210 and a dielectric layer.

Figure 24A:
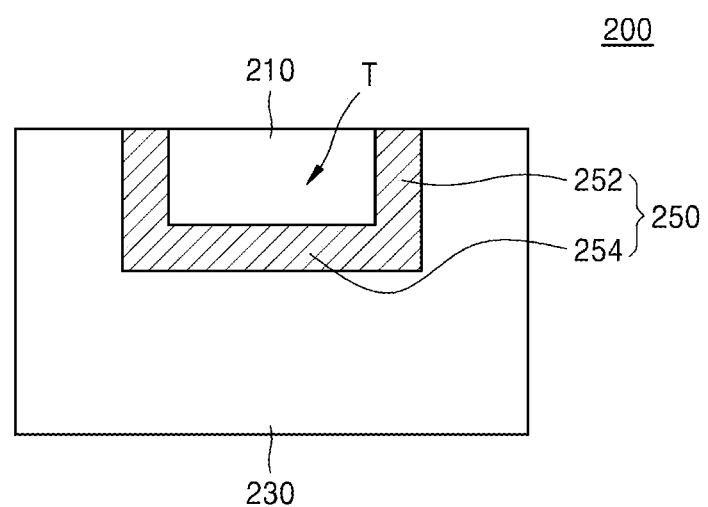
FIG. 24A is a cross-sectional view of a part of an interconnect structure of FIG. 23.
Figure 24B:
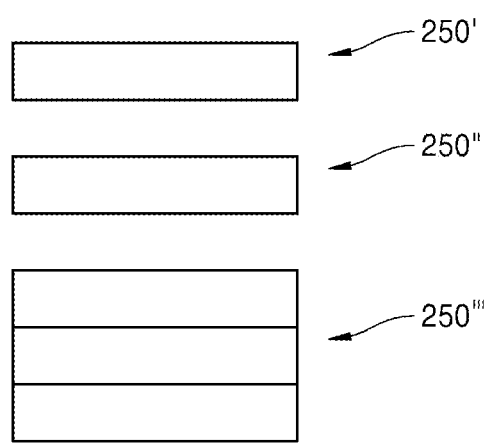
FIGS. 24B and 24C illustrate diffusion barrier layers and dielectric layers according to some example embodiments.
Figure 24C:
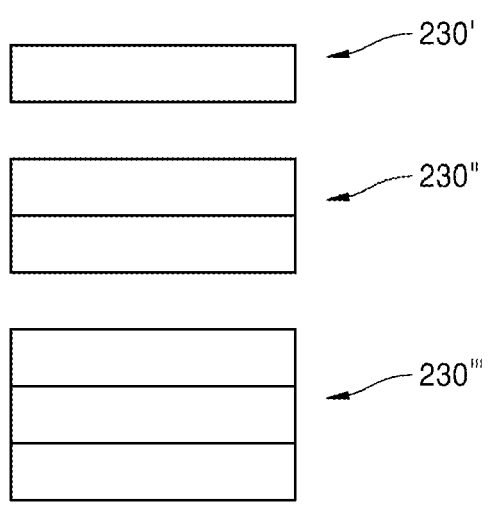

FIG. 24A is a cross-sectional view of a part of an interconnect structure 200 of FIG. 23, taken along line II-II in FIG. 23. FIGS. 24B and 24C illustrate diffusion barrier layers and dielectric layers according to some example embodiments.

Referring to FIG. 24A, the interconnect structure 200 may include a conductive layer 210, a dielectric layer 230 surrounding at least a part of the conductive layer 210, and a diffusion barrier layer 250 disposed between the conductive layer 210 and the dielectric layer 230 and limiting and/or preventing a metal material of the conductive layer 210 from diffusing into the dielectric layer 230. At least one of the dielectric layer 230 and the diffusion barrier layer 250 may include a nitride boron layer according to an embodiment, e.g., at least one of the amorphous boron nitride layer a-BN and the nanocrystalline boron nitride layer nc-BN. In FIG. 24A, it is described that the diffusion barrier layer 250 includes at least one of the amorphous boron nitride layer a-BN and the nanocrystalline boron nitride layer nc-BN. As depicted in FIG. 24B, the diffusion barrier layer 250 of FIG. 23 may have a film structure including an amorphous boron nitride layer (a-BN) 250', a nanocrystalline boron nitride layer (nc-BN) 250", or a multi-layer structure 250''' according to example embodiments. The multi-layer layer structure 250''' may include more than one amorphous boron nitride layer a-BN, more than one nanocrystalline boron nitride layer nc-BN, or a combination of one or more amorphous boron nitride layers a-BN and one or more nanocrystalline boron nitride layers nc-BN according to example embodiments.

The dielectric layer 230 may have a single layer structure, as depicted in the dielectric layer 230' in FIG. 24C, or a multilayer structure, as depicted in the dielectric layers 230" and 230''' in FIG. 24C, in which different materials are stacked. The dielectric layer 230 may include a dielectric material used in a general semiconductor manufacturing process. For example, the dielectric layer 230 may include silicon oxide, nitride, silicon nitride, silicon carbide, silicate, etc. However, this is merely an example and other various dielectric materials may be used as the dielectric layer 230. In addition, the dielectric layer 230 may include an organic dielectric material.

At least one trench T may be formed in the upper portion of the dielectric layer 230 and the conductive layer 210 may be disposed in the trench T of the dielectric layer 230. It is shown in the drawing that one trench is formed in the dielectric layer 230 but the present disclosure is not limited thereto. Two or more trenches T may be formed in the dielectric layer 230.

The conductive layer 210 may include a metal or a metal alloy having excellent electrical conductivity. For example, the conductive layer 210 may include Cu, Ru, Al, Co, W, Mo, Ti, Ta, Ni, Pt, Cr, Rh, Ir or an alloy thereof. However, the conductive layer 210 is not limited thereto, and various other metals may be used as the conductive layer 210.

The lower surface and both side surfaces of the conductive layer 210 may be disposed to face the dielectric layer 230. That is, the lower surface and both side surfaces of the conductive layer 210 may be surrounded by the dielectric layer 230.

The diffusion barrier layer 250 may be further disposed between the conductive layer 210 and the dielectric layer 230. For example, the diffusion barrier layer 250 may include a first diffusion barrier layer 252 facing both sides of the conductive layer 210 and a second diffusion barrier layer 254 facing the lower surface of the conductive layer 210.

The diffusion barrier layer 250 may include a boron nitride layer according to an embodiment. For example, the diffusion barrier layer 250 may include at least one of the amorphous boron nitride layer a-BN and the nanocrystalline boron nitride layer nc-BN. However, the diffusion barrier layer 250 is not limited thereto. The diffusion barrier layer 250 may include at least one of titanium (Ti) tantalum (Ta), tungsten (W), cobalt (Co), TiN, TaN, TiSiN, WC, Mn, and MnN. The diffusion barrier layer 250 may limit and/or prevent the material of the conductive layer 210 from diffusing toward the dielectric layer 230.

Because the diffusion barrier layer 250 includes at least one of the amorphous boron nitride layer a-BN and the nanocrystalline boron nitride layer nc-BN, the thickness of the diffusion barrier layer 250 may be reduced. For example, the thickness of the diffusion barrier layer 250 may be about 5 nm or less. In addition, because the dielectric layer 230, the diffusion barrier layer 250, the conductive layer 210, and the like may be formed at a low temperature, manufacturing is easy.

The amorphous boron nitride layer a-BN and the nanocrystalline boron nitride layer nc-BN are strong in physical rigidity and thus may be implemented in the flexible device layer 110 and may implement a flexible electronic apparatus.

Figure 25A:
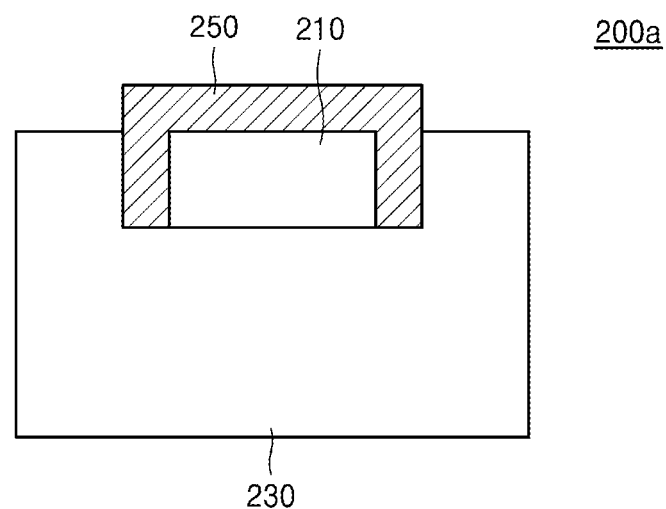
FIGS. 25A to 25H are diagrams illustrating interconnect structures according to another embodiment.
Figure 25B:
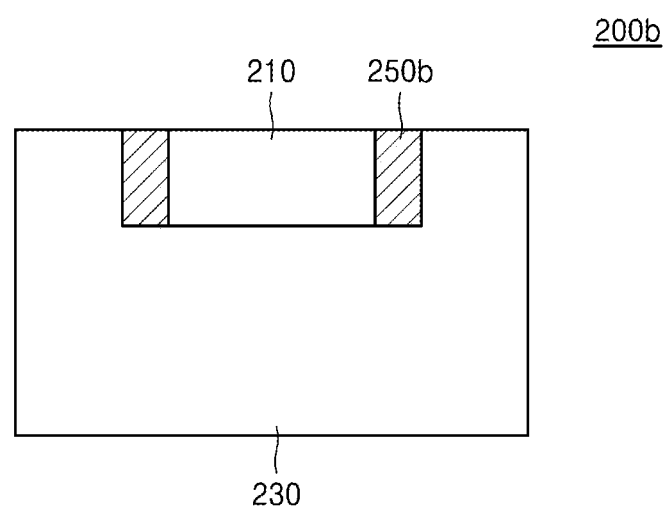
Figure 25C:
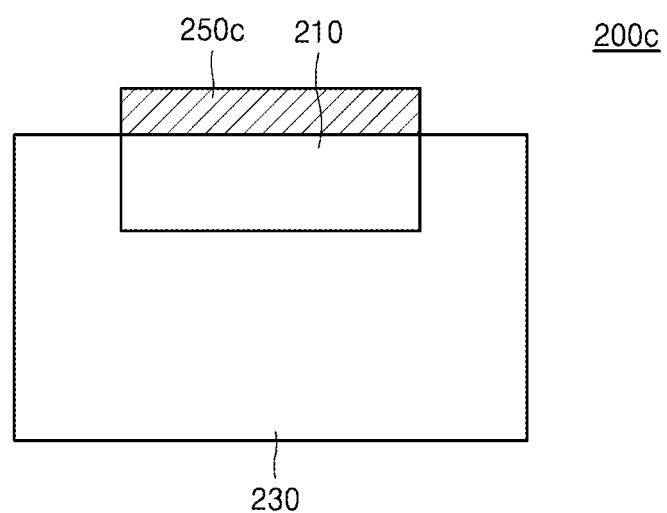
Figure 25D:
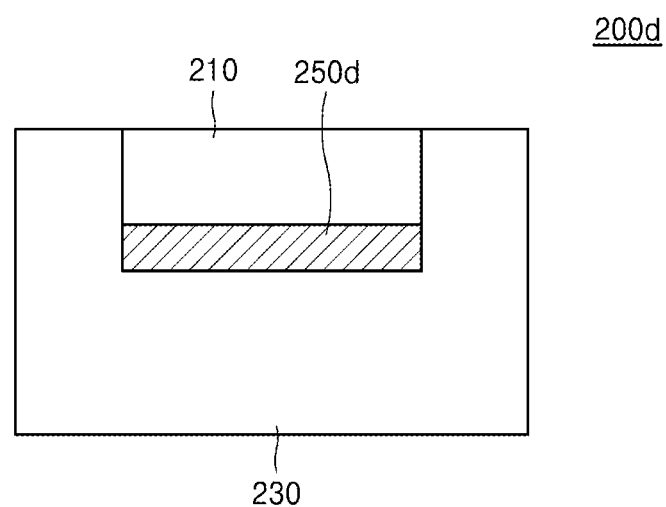

FIGS. 25A to 25H are diagrams illustrating interconnect structures 200a to 200h according to another embodiment. Upon comparing FIGS. 24A and 25A, a diffusion barrier layer 250a may be disposed to cover side surfaces and upper surface of the conductive layer 210. Alternatively, as shown in FIG. 25B, a diffusion barrier layer 250b may be disposed on the sidewall of the trench T to cover the side surface of the conductive layer 210. Alternatively, as shown in FIG. 25C, a diffusion barrier layer 250c may be disposed on the upper surface of the conductive layer 210, or as shown in FIG. 25D, a diffusion barrier layer 250d may be disposed on the lower wall of the trench T to contact the lower surface of the conductive layer 210.

As described above, the relationship between the diffusion barrier layers 250, 250a, 250b, 250c, and 250d and the conductive layer 210 may vary depending on the material of the conductive layer 210, a method of manufacturing the interconnect structure 120, etc. The diffusion barrier layer 250 may include at least one of the amorphous boron nitride layer a-BN and the nanocrystalline boron nitride layer nc-BN.

Figure 25E:
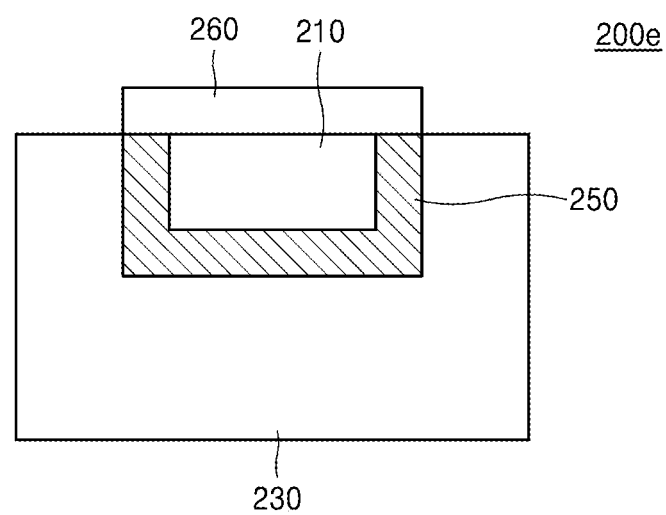

Alternatively, as illustrated in FIG. 25E, an interconnect structure 200e may further include a cap layer 260 disposed on the upper surface of the conductive layer 210. The cap layer 260 may include nanocrystalline graphene. The cap layer 260 may have a single layer structure or a multilayer structure in which different materials are stacked. The nanocrystalline graphene may include crystals having a size smaller than that of intrinsic graphene which is a general crystalline graphene. For example, the nanocrystalline graphene may include crystals having a nano level, specifically, a size of 100 nm or less. As will be described later, when the cap layer 260 including the nanocrystalline graphene is formed on the upper surface of the conductive layer 210, the electrical resistance of the conductive layer 210 may be reduced, and thus the electromigration resistance may be improved.

Figure 25F:
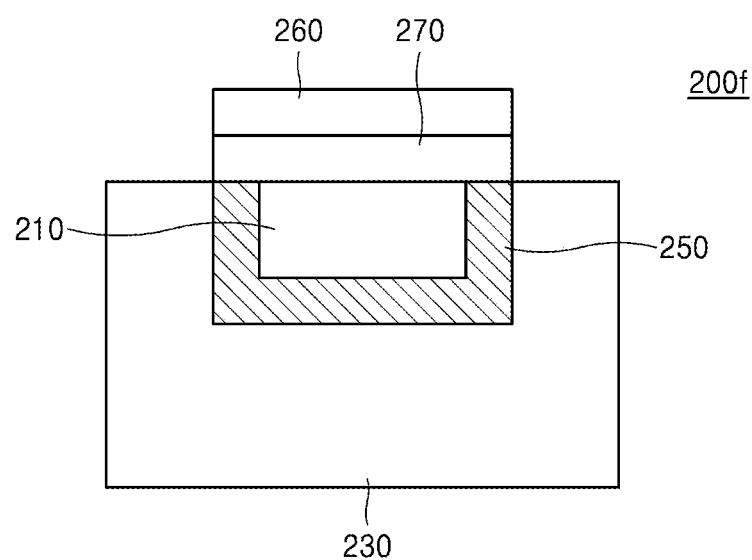

Alternatively, as illustrated in FIG. 25F, an interconnect structure 200f may further include a bonding layer 270 between the cap layer 260 and the conductive layer 210. Because the bonding layer 270 interface couples the conductive layer 210 and the cap layer 260, electrical movement between the conductive layer 210 and the cap layer 260 may be limited and/or suppressed.

The bonding layer 270 may form a carbide bond on the interface with the cap layer 260. The bonding layer 270 may include at least one metal selected from the group consisting of magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), cobalt (Co), ruthenium (Ru), and rhodium (Rh) and an alloy of the metal to form the carbide bond on the interface with the cap layer 260.

The cap layer 260 and the bonding layer 270 may limit and/or prevent the material of the conductive layer 210 from diffusing to other regions.

Figure 25G:
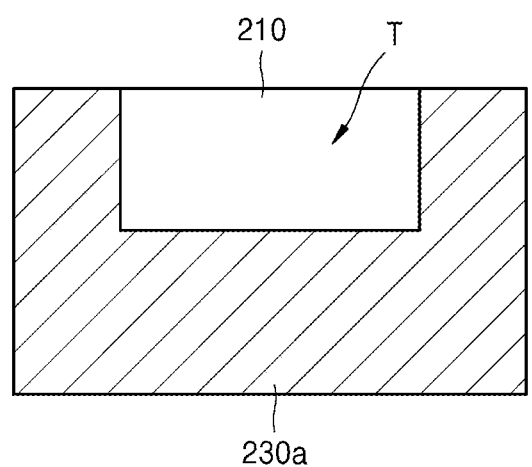

Alternatively, as illustrated in FIG. 25G, an interconnect structure 200g may be implemented only with the dielectric layer 230a including the trench T and the conductive layer 210 filling the trench T. The dielectric layer 230a of FIG. 25G may include at least one of the amorphous boron nitride layer a-BN and the nanocrystalline boron nitride layer nc-BN according to an embodiment. For example, the dielectric layer 230a may include a structure like the amorphous boron nitride layer (a-BN) 250', the nanocrystalline boron nitride layer (nc-BN) 250", or the multi-layer structure 250''' discussed in FIG. 24B. Because the amorphous boron nitride layer a-BN and the nanocrystalline boron nitride layer nc-BN have a low dielectric constant, the amorphous boron nitride layer a-BN and the nanocrystalline boron nitride layer nc-BN may function as an interlayer insulating layer.

When the dielectric layer 230a includes at least one of the amorphous boron nitride layer a-BN and the nanocrystalline boron nitride layer nc-BN, the interconnect structure 200g may not include separately the diffusion barrier layer 250. That is, the dielectric layer 230a including the amorphous boron nitride layer a-BN or the nanocrystalline boron nitride layer nc-BN not only functions as an interlayer insulating layer but also functions as a diffusion barrier layer. The amorphous boron nitride layer a-BN or the nanocrystalline boron nitride layer nc-BN according to an embodiment has a low dielectric constant, so it may perform a function of the interlayer insulating layer even having a small thickness, the dielectric layer 230a may have a thickness of about 5 nm or more. The dielectric layer 230a may have a thickness of about 10 nm or more.

Figure 25H:
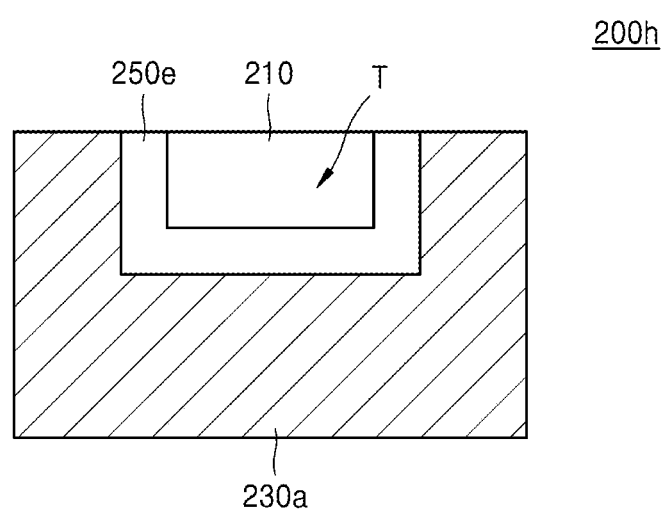

As shown in FIG. 25H, an interconnect structure 200h may include a dielectric layer 230a including the trench T, the conductive layer 210 filling the trench T, and a diffusion barrier layer 250e disposed between the dielectric layer 230a and the conductive layer 210 to limit and/or prevent the diffusion of the material. The dielectric layer 230a of FIG. 25H may include at least one of the amorphous boron nitride layer a-BN and the nanocrystalline boron nitride layer nc-BN according to an embodiment, but is not limited thereto. The dielectric layer 230a of FIG. 25H may further include a dielectric material used in a general semiconductor manufacturing process.

The diffusion barrier layer 250e may include at least one of titanium (Ti), tantalum (Ta), tungsten (W), cobalt (Co), Mn, MnN, TiN, TaN, TiSiN compounds, and WC.

Figure 26A:
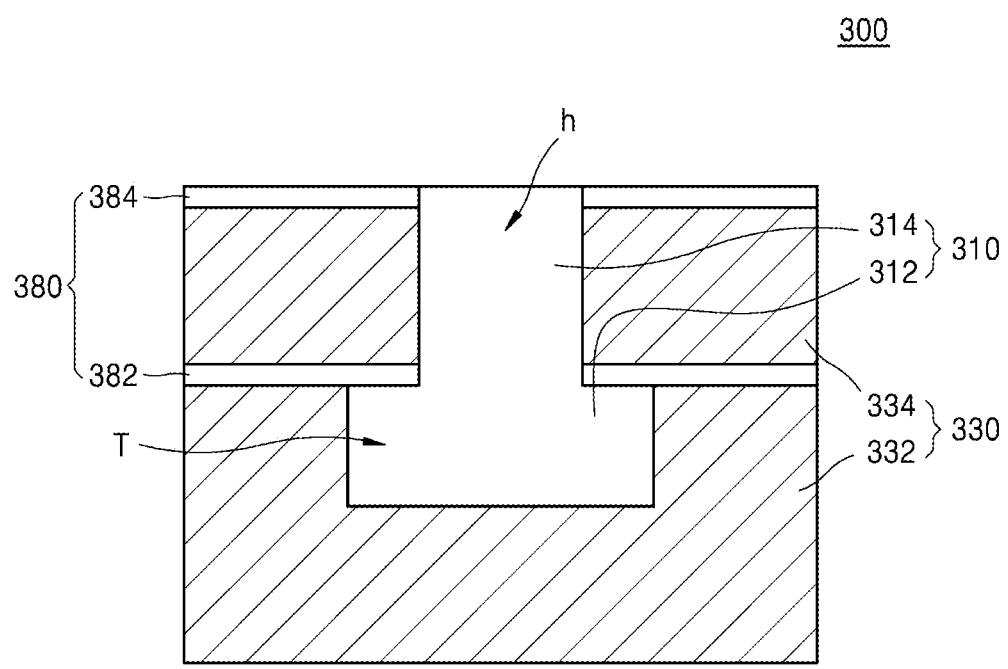
FIGS. 26A to 26E are diagrams illustrating interconnect structures according to another embodiment.

FIGS. 26A to 26E are diagrams illustrating interconnect structures 300 to 300d according to another embodiment. As shown in FIG. 26A, the interconnect structure 300 may include a first dielectric layer 332 in which the trench T is formed, and a second dielectric layer 334 disposed on the first dielectric layer 332 and in which a via hole h is formed. At least one of the first and second dielectric layers 332 and 334 may include at least one of the amorphous boron nitride layer a-BN and the nanocrystalline boron nitride layer nc-BN according to an embodiment.

A first conductive layer 312 may be filled in the trench T formed in the first dielectric layer 332, and a second conductive v 314 may be filled in the via hole h formed in the second dielectric layer 334. In addition, the first conductive layer 312 and the second conductive layer 314 may be electrically connected.

In addition, the interconnect structure 300 may include a first etch stop layer 382 disposed between the first dielectric layer 332 and the second dielectric layer 334 and a second etch stop layer 384 disposed on the upper surface of the second dielectric layer 334. The first and second etch stop layers 382 and 384 may include SiN, SiON, SiC, SiCN, or a combination thereof. The first and second etch stop layers 382 and 384 may be used to selectively etch the first and second dielectric layers 332 and 334 when the interconnect structure 300 is manufactured by using a damascene process.

The interconnect structure 300 by using the damascene process may improve the vertical profile of a via hole, thereby increasing the breakdown voltage of the interconnect structure 300. In FIG. 26A, when the first and second dielectric layers 332 and 334 include at least one of the amorphous boron nitride layer a-BN and the nanocrystalline boron nitride layer nc-BN, the interconnect structure 300 may not include a separate diffusion barrier layer.

Alternatively, the amorphous boron nitride layer a-BN and the nanocrystalline boron nitride layer nc-BN according to an embodiment may be used as the diffusion barrier layer 250. Upon comparing FIGS. 26A and 26B, the interconnect structure 300a of FIG. 26B may further include a diffusion barrier layer 350. The diffusion barrier layer 350 may include a first diffusion barrier layer 352 disposed on the inner wall of the trench T and a second diffusion barrier layer 354 disposed on the inner wall of the via hole h.

Figure 26B:
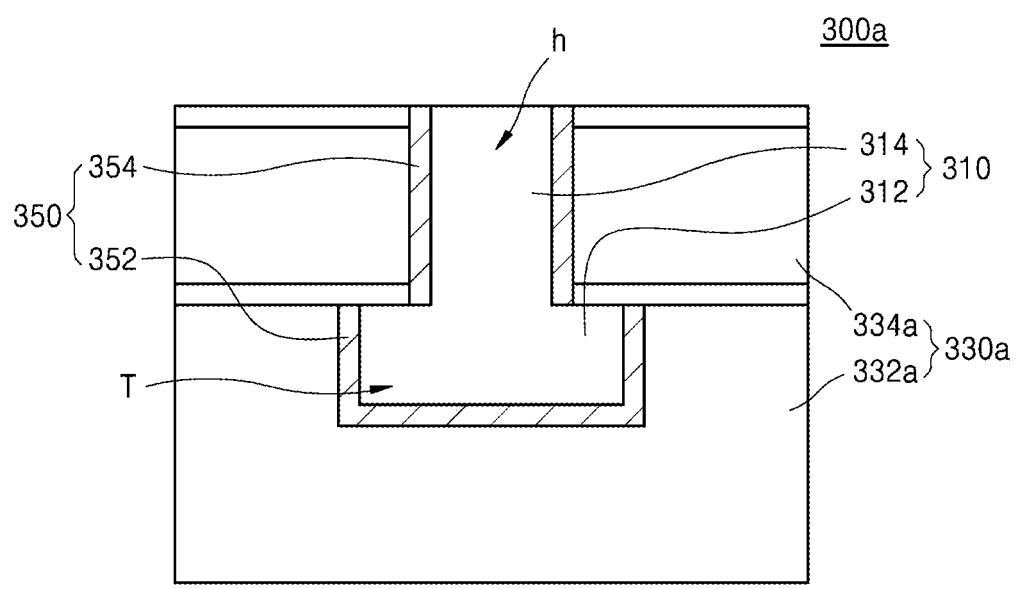

The diffusion barrier layer 350 of FIG. 26B may include at least one of the amorphous boron nitride layer a-BN and the nanocrystalline boron nitride layer nc-BN according to an embodiment. In addition, the first and second dielectric layers 332 and 334 of FIG. 26B may include a dielectric material used in a general semiconductor manufacturing process. In FIG. 26B, the diffusion barrier layer 350 is disposed on both the inner wall of the trench T and the inner wall of the via hole h, but is not limited thereto. The diffusion barrier layer 350 may be disposed only in a partial region of the inner wall of the trench T and the inner wall of the via hole h.

Alternatively, the first dielectric layer 332a may include at least one of the amorphous boron nitride layer a-BN and the nanocrystalline boron nitride layer nc-BN according to an embodiment, and the first diffusion barrier layer 352 may not be disposed in the trench T. In addition, the second dielectric layer 334a may include a dielectric material used in a general semiconductor manufacturing process, and the second diffusion barrier layer 354 including at least one of the amorphous boron nitride layer a-BN and the nanocrystalline boron nitride layer nc-BN according to an embodiment may be disposed in the via hole h. Alternatively, materials of the second dielectric layer 334a and the second diffusion barrier layer 354 may be disposed in an opposite way to the materials described above.

Figure 26C:
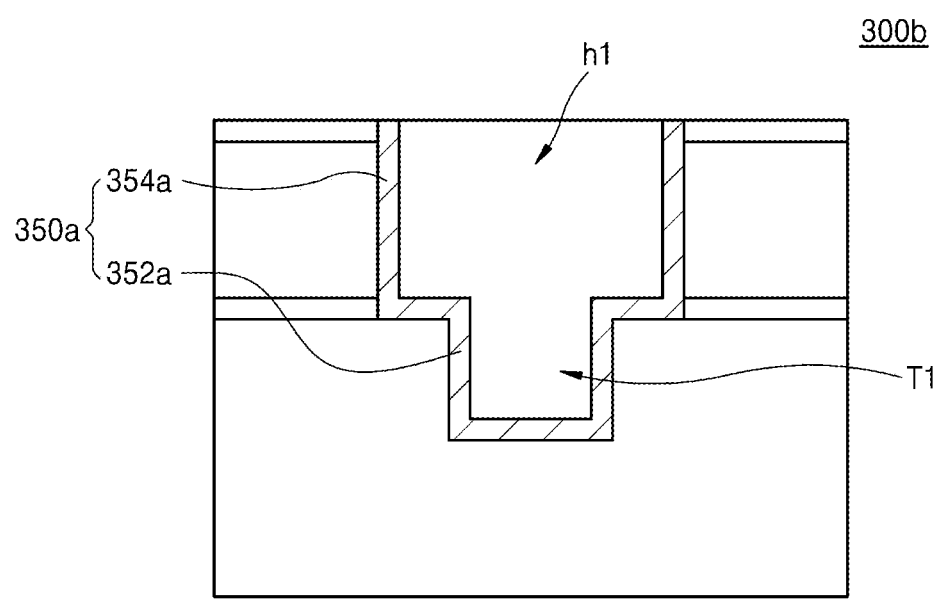

Alternatively, as illustrated in FIG. 26C, the width of a via hole h1 of the interconnect structure 300b may be larger than the width of a trench T1. In addition, the first diffusion barrier layer 352a and the second diffusion barrier layer 354a may be in contact with each other to form one diffusion barrier layer 350a. In the drawing, the width of the via hole h1 is greater than the width of the trench T1, but is not limited thereto. Even when the width of the via hole h1 is smaller than the width of the trench T1, the first and second diffusion barrier layers 352a and 354a may be in contact with each other to be integrated.

Figure 26D:
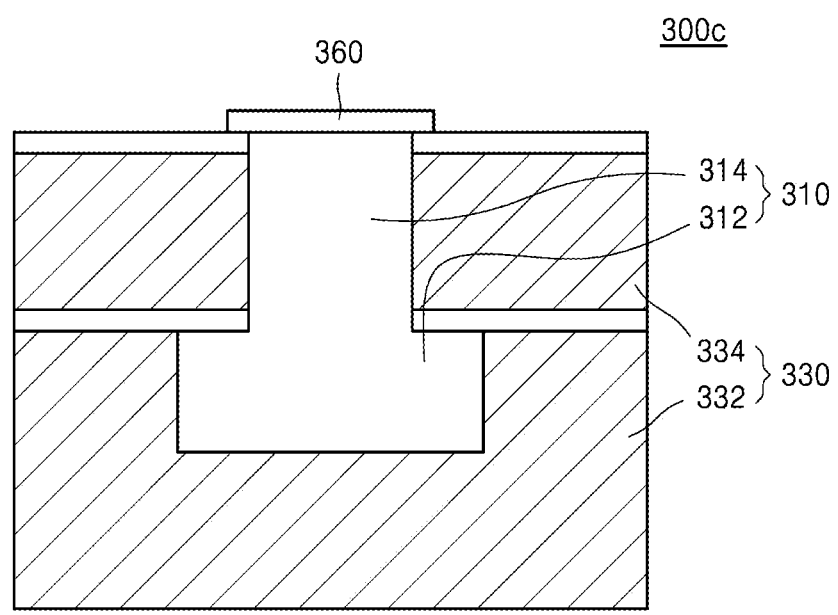

Alternatively, as illustrated in FIG. 26D, the interconnect structure 300c may further include a cap layer 360. A bonding layer (not shown) may be further disposed between the cap layer 360 and a conductive layer. The cap layer and the bonding layer have been described above, and thus detailed descriptions thereof will be omitted.

Figure 26E:
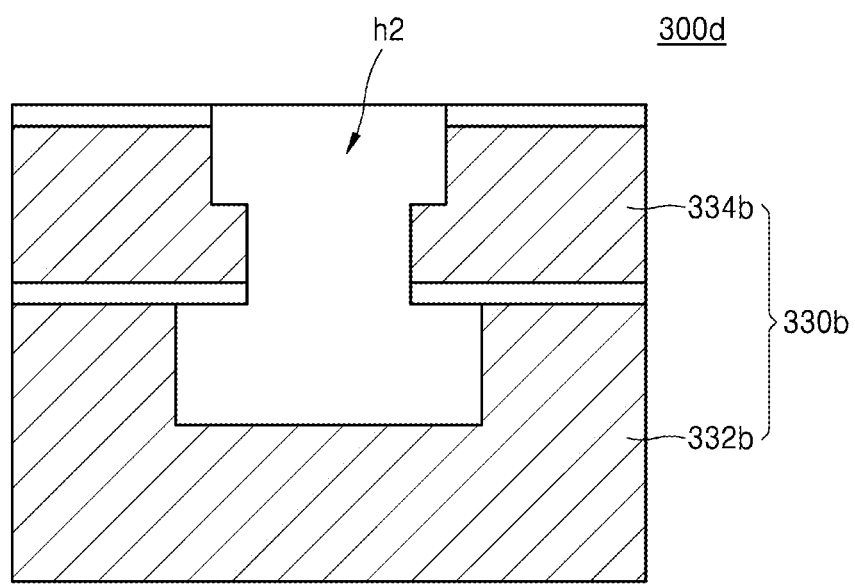

Alternatively, as illustrated in FIG. 26E, the interconnect structure 300d may include a stepped via hole h1. The via hole h1 may be produced by using a dual damascene process. The number of steps of the via hole h1 may vary depending on a processing process.

As described above, because the amorphous boron nitride layer a-BN and the nanocrystalline boron nitride layer nc-BN are chemically stable, the amorphous boron nitride layer a-BN and the nanocrystalline boron nitride layer nc-BN may be used as a diffusion barrier of an interconnect structure. In addition, the amorphous boron nitride layer a-BN and the nanocrystalline boron nitride layer nc-BN according to an embodiment have a low dielectric constant, and thus the amorphous boron nitride layer a-BN and the nanocrystalline boron nitride layer nc-BN are used as an interlayer insulating layer between conductive material layers to reduce parasitic capacitance. In addition, the amorphous boron nitride layer a-BN and the nanocrystalline boron nitride layer nc-BN according to an embodiment may be formed at a low temperature and thus may be formed on the device layer 110 without damaging the device layer 110.

Figure 27:
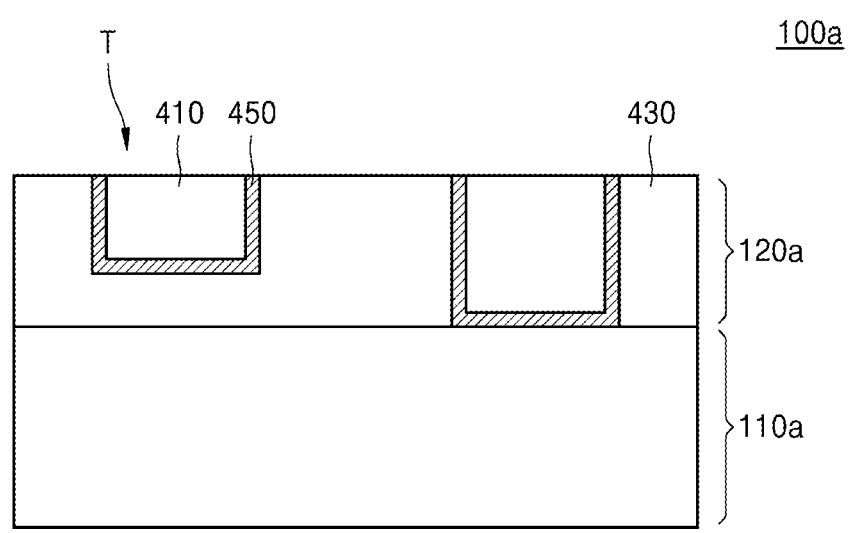
FIG. 27 is a diagram schematically illustrating an electronic apparatus including an interconnect structure according to another embodiment.

FIG. 27 is a reference diagram illustrating an electronic apparatus 100a including an interconnect structure 120a according to another embodiment.

Referring to FIG. 27, the electronic apparatus 100a may include a substrate 110a and the interconnect structure 120a provided on the substrate 110a. Here, the interconnect structure 120a may include a conductive layer 410, a dielectric layer 430, and a diffusion barrier layer 450.

The substrate 110a may be a semiconductor substrate. For example, the substrate 110a may include a Group IV semiconductor material, a Group III/V semiconductor compound, or a Group II/VI semiconductor compound. As a specific example, the substrate 110a may include Si, Ge, SiC, SiGe, SiGeC, Ge Alloy, GaAs, InAs, InP, etc. However, this is merely an example and various other semiconductor materials may be used as the substrate 110a.

The substrate 110a may include a single layer or a plurality of layers in which different materials are stacked. The substrate 110a may include, for example, a silicon-oninsulator (SOI) substrate or a silicon germanium-on-insulator (SGOI) substrate. In addition, the substrate 110a may include a non-doped semiconductor material or a doped semiconductor material.

The substrate 110a may include at least one semiconductor device (not shown). The semiconductor device may include, for example, at least one of a transistor, a capacitor, a diode, and a resistor. However, the semiconductor device is not limited thereto.

The dielectric layer 430 may be formed on the substrate 110a. The dielectric layer 430 may have a single layer structure or a multilayer structure in which different materials are stacked. The dielectric layer 430 may include a dielectric material used in a general semiconductor manufacturing process. For example, the dielectric layer 430 may include silicon oxide, nitride, silicon nitride, silicon carbide, silicate, etc. However, this is merely an example and other various dielectric materials may be used as the dielectric layer 430. In addition, the dielectric layer 430 may include an organic dielectric material.

At least one trench T may be formed in the dielectric layer 430 at a predetermined depth. Here, the at least one trench T may be formed not to contact the substrate 110a or may be formed to contact the substrate 110a. In FIG. 27, two trenches T are formed in the dielectric layer 430, one of which is formed not to contact the substrate 110a and the other one is formed to contact the substrate 110a.

The conductive layer 410 is provided to fill the inside of the trench T. A diffusion barrier layer 450 is provided on the inner wall of the trench T. Here, the diffusion barrier layer 450 may be provided to cover the conductive layer 410 between the dielectric layer 430 and the conductive layer 410. Specifically, the diffusion barrier layer 450 may be provided on the inner wall of the trench T to cover the side and lower surfaces of the conductive layer 410. The upper surface of the conductive layer 410 may be exposed by the diffusion barrier layer 450. The diffusion barrier layer 450 may serve to limit and/or prevent diffusion of the material forming the conductive layer 410. Meanwhile, the diffusion barrier layer 450 may additionally serve as an adhesive layer between the dielectric layer 430 and the conductive layer 410. The diffusion barrier layer 450 may include the amorphous boron nitride layer a-BN or the nanocrystalline boron nitride layer nc-BN according to an embodiment.

Figure 28:
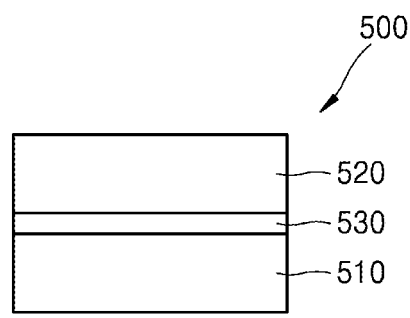
FIG. 28 is a diagram illustrating a multilayer structure including a diffusion barrier layer according to an embodiment.

FIG. 28 is a diagram illustrating a multilayer structure 500 including a diffusion barrier layer 530 according to an embodiment. As shown in FIG. 28, the multilayer structure 500 may include a first material layer 510, a second material layer 520 apart from the first material layer 510, and the diffusion barrier layer 530 between the first material layer 510 and the second material layer 520.

The first material layer 510 and the second material layer 520 may include different materials. The diffusion barrier layer 530 may suppress or prevent the movement (diffusion) of materials (atoms) between the first material layer 510 and the second material layer 520. The diffusion barrier layer 530 may include at least one of the amorphous boron nitride layer a-BN and the nanocrystalline boron nitride layer nc-BN described above. In addition, the diffusion barrier layer 530 may further include a material other than the amorphous boron nitride layer a-BN and the nanocrystalline boron nitride layer nc-BN. For example, the diffusion barrier layer 530 may include a metal chalcogenide-based material having a two-dimensional crystal structure and graphene. One of the first and second material layers 510 and 520 of FIG. 28 may be a conductive material, and the other may be a semiconductor material. Alternatively, one of the first and second material layers 510 and 520 may be a conductive material, and the other may be an insulating material.

For example, the first material layer 510 may be an insulating layer and the second material layer 520 may be a conductive layer. The first material layer 510 may be an insulating layer including silicon oxide, silicon nitride, silicon nitride, etc., or including a high dielectric material having a dielectric constant higher than that of silicon nitride. Alternatively, the first material layer 510 may include an organic insulating material. Any insulating material used for general electronic devices or semiconductor devices may be applied to the first material layer 510. The second material layer 520 may be a metal layer or a metal compound layer. In this case, the diffusion barrier layer 530 may suppress/prevent the movement/diffusion of the material of the second material layer 520, for example, metal atoms, to the first material layer 510.

Figure 29:
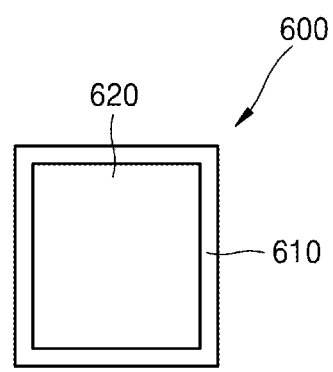
FIG. 29 is a cross-sectional view illustrating a multilayer structure including a diffusion barrier layer according to another embodiment.

FIG. 29 is a cross-sectional view illustrating a multilayer structure 600 including a diffusion barrier layer 610 according to another embodiment.

Referring to FIG. 29, the diffusion barrier layer 610 may be provided to cover at least one surface of a conductive layer 620. For example, the diffusion barrier layer 610 may be provided to cover the entire side surface of the conductive layer 620. The conductive layer 620 may be a layer including a metal or a metal compound. The diffusion barrier layer 610 may further include a material other than the amorphous boron nitride layer a-BN and the nanocrystalline boron nitride layer nc-BN. Although not shown, another material layer bonded to the conductive layer 620 may be further provided with the diffusion barrier layer 610 therebetween. The other material layer may be a semiconductor layer or an insulating layer. In addition, a predetermined adhesive layer may be further provided between the diffusion barrier layer 610 and the conductive layer 620. Although not shown, the diffusion barrier layer 610 may be provided to surround the entire side surface of a conductive material layer.

In addition, the amorphous boron nitride layer a-BN and the nanocrystalline boron nitride layer nc-BN may be used as a diffusion barrier layer in an electronic apparatus. The boron nitride layer may grow directly on the electronic apparatus or boron nitride layer may grow on a base substrate and may be transferred to the electronic apparatus.

In addition, the movement (diffusion) of materials (or atoms) between two material layers is suppressed or excellent in performance, and thus the boron nitride layer may perform the function of a diffusion barrier layer even or an interlayer insulating layer at a thin thickness. Thus, a degree of integration of an integrated circuit (or a transistor) may increase.

Figure 30:
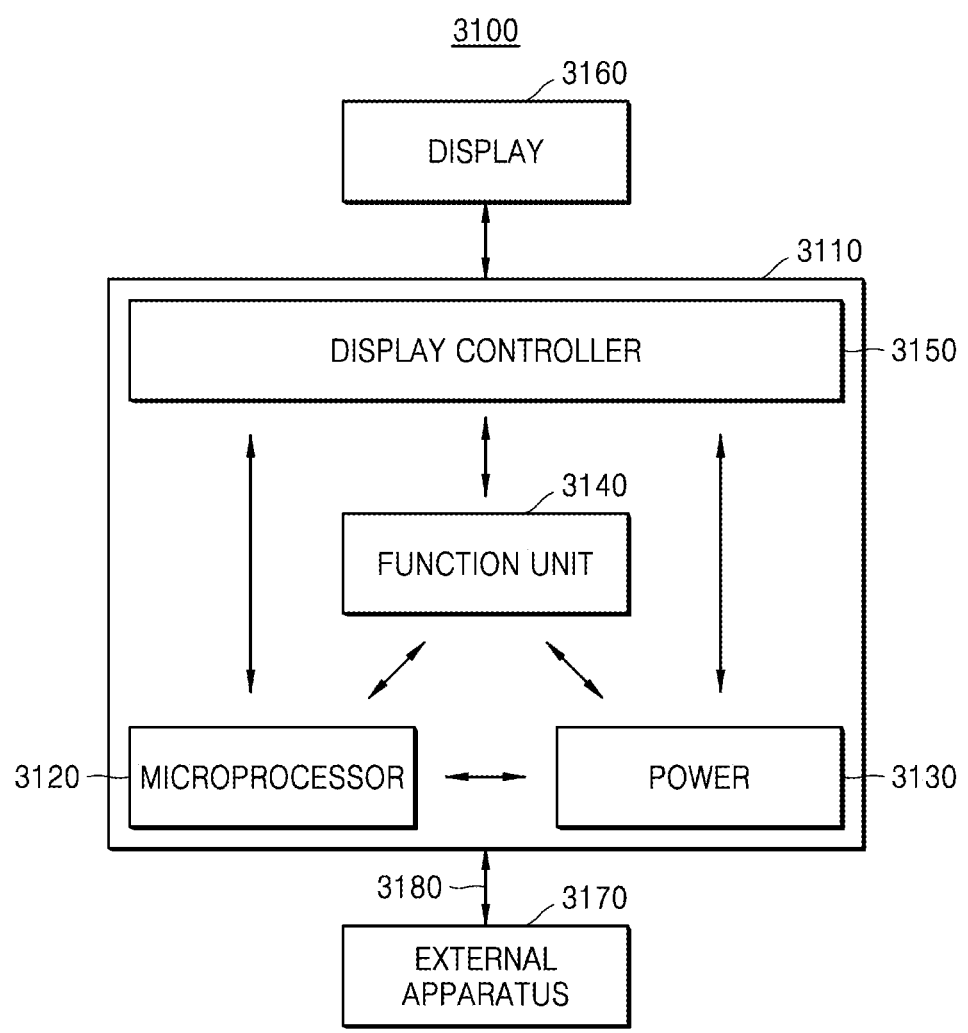
FIGS. 30 and 31 are system block diagrams of electronic devices according to example embodiments of the inventive concepts.
Figure 31:
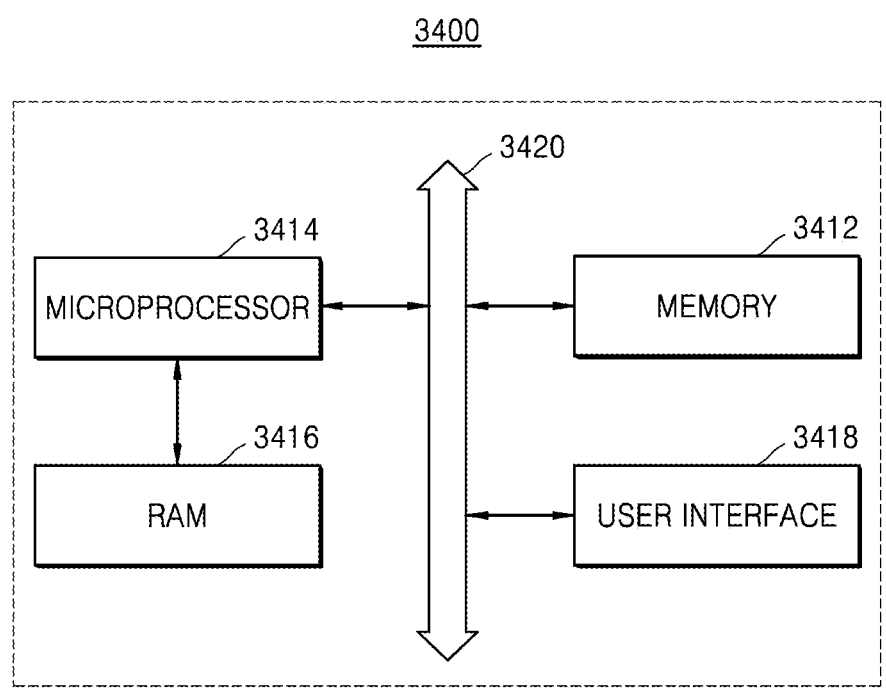

FIGS. 30 and 31 are system block diagrams of electronic devices according to example embodiments of the inventive concepts.

Referring to FIG. 30, the electronic apparatus 100 in FIG. 23 may be applied to an electronic system 3100. The electronic system 3100 may include a body 3110, a microprocessor 3120, a power supply 3130, a function unit 3140, and a display controller 3150. The body 3110 may be a mother board formed by a printed circuit board (PCB). The microprocessor unit 3120, the power supply 3130, the function unit 3140, and the display controller 3150 may be mounted on the body 3110. A display 3160 may be disposed inside the body 3110 or outside the body 3110. For example, the display 3160 may be disposed on a surface of the body 3110, and then may display an image processed by the display controller 3150.

The power supply 3130 may receive a constant voltage from an external power supply, divide the voltage into various voltages levels, and supply those voltages to the microprocessor 3120, the function unit 3140 and/or the display controller 3150. The microprocessor unit 3120 may receive a voltage from the power supply 3130 to control the function unit 3140 and the display 3160. The function unit 3140 may perform various functions of the electronic system 3100. For example, when the electronic system 3100 is a smart phone, the function unit 32140 may include various components which perform mobile phone functions, e.g., dialing, outputting an image to the display 3160, or outputting a voice to a speaker through communication with an external apparatus 3170, and when a camera is included, the function unit 3140 may serve as a camera image processor.

In example embodiments of the inventive concepts, when the electronic system 3100 is connected to a memory card to expand the capacity thereof, the function unit 3140 may be a memory card controller. The function unit 3140 may exchange signals with the external apparatus 3170 through a wired or wireless communication unit 3180. Furthermore, when the electronic system 3100 requires a Universal Serial Bus (USB) to expand the functions thereof, the function unit 3140 may serve as an interface controller. In addition, the function unit 3140 may include a mass storage device.

Referring to FIG. 31, an electronic system 3400 may include at least one of the semiconductor devices in accordance with various example embodiments of the inventive concepts. The electronic system 3400 may be applied to a mobile device or a computer. For example, the electronic system 3400 may include a memory system 3412, a microprocessor 3414, a RAM 3416, a bus 3420, and a user interface 3418. The microprocessor 3414, the memory system 3412, and the user interface 3418 may be connected to each other through the bus 3420. The user interface 3418 may be used to input data to the electronic system 3400, or output data from the electronic system 3400. The microprocessor 3414 may program and control the electronic system 3400. The RAM 3416 may be used as an operational memory of the microprocessor 3414. The microprocessor 3414, the RAM 3416, and/or other components may be assembled within a single package. The memory system 3412 may store operational codes of the microprocessor 3414, data processed by the microprocessor 3414, or data received from the outside. The memory system 3412 may include a controller and a memory.

In some embodiments, the display 3160, display controller 3150, function unit 3140, microprocessor 3120, or power supply 3110 of FIG. 30, and/or microprocessor 3414, RAM 3416, bus 3420, memory 3412, or user interface 3418 of FIG. 31 may include the electronic apparatus 100 of FIG. 23 and/or an interconnect structure based on the interconnect structures 200 to 200h in FIGS. 24 and 25B to 25H, and/or interconnect structures 300 to 300d according to FIGS. 26A to 26E.

The display 3160, display controller 3150, function unit 3140, microprocessor 3120, or power supply 3110 of FIG. 30, and/or microprocessor 3414, RAM 3416, bus 3420, memory 3412, or user interface 3418 of FIG. 31 may be implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In the above, although the embodiment of a boron nitride layer has been illustrated and described above, the present disclosure is not limited to the specific embodiments described above, and does not depart from the gist of the present disclosure as claimed in the claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An interconnect structure comprising:
a conductive layer;
a dielectric layer surrounding at least a part of the conductive layer; and
a diffusion barrier layer between the conductive layer and the dielectric layer, the diffusion barrier layer configured to limit a conductive material of the conductive layer from diffusing into the dielectric layer,
at least one of the dielectric layer and the diffusion barrier layer including at least one of an amorphous boron nitride layer and a nanocrystalline boron nitride layer, wherein
at least one of the dielectric layer and the diffusion barrier layer has a hydrogen content of about 10% or less and greater than 0%,
the amorphous boron nitride layer includes one or more crystals having a size of about 3 nm or less, and
the nanocrystalline boron nitride layer includes one or more crystals having a size of about 0.5 nm to about 100 nm.

2. The interconnect structure of claim 1, wherein
the diffusion barrier layer comprises at least one of the amorphous boron nitride layer and the nanocrystalline boron nitride layer, and
the dielectric layer comprises a different dielectric material from a material of the diffusion barrier layer.

3. The interconnect structure of claim 1, wherein the dielectric layer and the diffusion barrier layer each comprise at least one of the amorphous boron nitride layer and the nanocrystalline boron nitride layer.

4. The interconnect structure of claim 3, wherein the dielectric layer and the diffusion barrier layer are integrated with each other.

5. The interconnect structure of claim 1, wherein
the dielectric layer comprises at least one of the amorphous boron nitride layer and the nanocrystalline boron nitride layer, and
the diffusion barrier layer comprises a metal other than boron.

6. The interconnect structure of claim 1, wherein a thickness of the diffusion barrier layer is about 5 nm or less.

7. The interconnect structure of claim 1, wherein a thickness of the dielectric layer is about 5 nm or more.

8. The interconnect structure of claim 1, wherein at least one of the dielectric layer and the diffusion barrier layer has a dielectric constant of about 2.5 or less at an operating frequency of 100 kHz.

9. The interconnect structure of claim 1, wherein at least one of the dielectric layer and the diffusion barrier layer has a ratio of boron to nitrogen of about 0.9 to about 1.1.

10. The interconnect structure of claim 1, wherein at least one of the dielectric layer and the diffusion barrier layer is non-porous.

11. The interconnect structure of claim 1, wherein at least one of the dielectric layer and the diffusion barrier layer comprises at least one pore.

12. The interconnect structure of claim 1, wherein at least one of the dielectric layer and the diffusion barrier layer has a mass density of about 1 to about 3 g/cm$^3$.

13. The interconnect structure of claim 1, wherein a breakdown field of at least one of the dielectric layer and the diffusion barrier layer is about 4 MV·cm$^{-1}$ or more.

14. The interconnect structure of claim 1, wherein at least one of the dielectric layer and the diffusion barrier layer has about 0.3 to about 0.6 root-mean-square (RMS) roughness value.

15. The interconnect structure of claim 1, wherein
the dielectric layer comprises a first dielectric layer comprising a trench of a first depth,
the diffusion barrier layer comprises a first diffusion barrier layer on an inner wall of the trench, and
the conductive layer comprises a first conductive layer filling an inside of the trench.

16. The interconnect structure of claim 1, wherein
the dielectric layer comprises a second dielectric layer comprising a via hole,
the diffusion barrier layer comprises a second diffusion barrier layer disposed on an inner wall of the via hole, and
the conductive layer comprises a second conductive layer filling an inside of the via hole.

17. The interconnect structure of claim 16, wherein the via hole is stepped.

18. An electronic apparatus comprising:
a device layer comprising at least one of a transistor, a capacitor, and a resistor; and
the interconnect structure of claim 1 connected to the device layer.

19. The electronic apparatus of claim 18, wherein the device layer comprises at least one of a memory device, a display device, and an integrated circuit device.

20. An interconnect structure comprising:
a conductive layer; and
a boron nitride structure surrounding at least part of the conductive layer,
the boron nitride structure including at least one of an amorphous boron nitride layer and a nanocrystalline boron nitride layer, and
the boron nitride structure configured to limit a conductive material of the conductive layer from diffusing through at least a portion of the boron nitride structure, wherein
at least one of the amorphous boron nitride layer and the nanocrystalline boron nitride layer has a hydrogen content of about 10% or less,
the amorphous boron nitride layer includes one or more crystals having a size of about 3 nm or less, and
the nanocrystalline boron nitride layer includes one or more crystals having a size of about 0.5 nm to about 100 nm.

21. The interconnect structure of claim 1, further comprising:
a substrate, wherein
the conductive layer is on the substrate,
the diffusion barrier layer includes the amorphous boron nitride layer, the nanocrystalline boron nitride layer, or both the amorphous boron nitride layer and the nanocrystalline boron nitride layer, and
the diffusion barrier layer covers at least one of a bottom of the conductive layer and an upper surface of the conductive layer.

* * * * *